(12) United States Patent
Yamamoto et al.

(10) Patent No.: US 9,034,740 B2
(45) Date of Patent: May 19, 2015

(54) METHOD FOR MANUFACTURING A POROUS INSULATION FILM AND A METHOD FOR MANUFACTURING A SEMICONDUCTOR DEVICE COMPRISING A POROUS INSULATION FILM

(71) Applicant: Renesas Electronics Corporation, Kanagawa (JP)

(72) Inventors: Hironori Yamamoto, Kanagawa (JP); Fuminori Ito, Kanagawa (JP); Yoshihiro Hayashi, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 13/887,668

(22) Filed: May 6, 2013

(65) Prior Publication Data

US 2013/0299952 A1     Nov. 14, 2013

(30) Foreign Application Priority Data

May 8, 2012  (JP) ................... 2012-106812

(51) Int. Cl.
*H01L 21/33*   (2006.01)
*H01L 21/02*   (2006.01)
*H01L 29/02*   (2006.01)
*H01L 21/768*  (2006.01)
(Continued)

(52) U.S. Cl.
CPC .......... *H01L 21/02203* (2013.01); *H01L 29/02* (2013.01); *H01L 23/53238* (2013.01); *H01L 23/5329* (2013.01); *H01L 23/53295* (2013.01); *H01L 21/02126* (2013.01); *H01L 21/02216* (2013.01); *H01L 21/02274* (2013.01); *H01L 27/228* (2013.01); *H01L 2924/0002* (2013.01); *H01L 21/7682* (2013.01); *H01L 21/76825* (2013.01); *H01L 2221/1047* (2013.01)

(58) Field of Classification Search
CPC .................. H01L 21/02274; H01L 21/02203; H01L 21/17682
USPC ......... 438/479, 517–518, 653, 675, 761, 780; 257/741, 761–762, E21.26, E21.584, 257/E21.586, E21.21; 428/446–447
See application file for complete search history.

(56) References Cited

U.S. PATENT DOCUMENTS

| 7,968,471 B2 | 6/2011 | Harada et al. |
| 2009/0246538 A1 | 10/2009 | Yamamoto et al. |
| 2010/0025852 A1* | 2/2010 | Ueki et al. ................... 257/761 |

(Continued)

FOREIGN PATENT DOCUMENTS

| JP | 2010-021575 | 1/2010 |
| JP | 2011-192962 | 9/2011 |

(Continued)

*Primary Examiner* — Dung Le
(74) *Attorney, Agent, or Firm* — Young & Thompson

(57) ABSTRACT

The deposition rate of a porous insulation film is increased, and the film strength of the porous insulation film is improved. Two or more organic siloxane raw materials each having a cyclic SiO structure as a main skeleton thereof, and having mutually different structures, are vaporized, and transported with a carrier gas to a reactor (chamber), and an oxidant gas including an oxygen atom is added thereto. Thus, a porous insulation film is formed by a plasma CVD (Chemical Vapor Deposition) method or a plasma polymerization method in the reactor (chamber). In the step, the ratio of the flow rate of the added oxidant gas to the flow rate of the carrier gas is more than 0 and 0.08 or less.

13 Claims, 21 Drawing Sheets

(51) Int. Cl.
*H01L 23/532* (2006.01)
*H01L 27/22* (2006.01)

(56) References Cited

U.S. PATENT DOCUMENTS

2010/0219512 A1 9/2010 Tada et al.
2011/0201212 A1 8/2011 Yamamoto et al.

FOREIGN PATENT DOCUMENTS

WO WO2007/032261 3/2007
WO WO2008/010591 1/2008

* cited by examiner

METHOD FOR MANUFACTURING A POROUS INSULATION FILM AND A METHOD FOR MANUFACTURING A SEMICONDUCTOR DEVICE COMPRISING A POROUS INSULATION FILM

CROSS-REFERENCE TO RELATED APPLICATIONS

The disclosure of Japanese Patent Application No. 2012-106812 filed on May 8, 2012 including the specification, drawings and abstract is incorporated herein by reference in its entirety.

BACKGROUND

The present invention relates to a method for manufacturing a semiconductor device, and a semiconductor device.

In recent years, in order to reduce the relative dielectric constant of the interlayer insulation film, there have been proposed various methods.

Patent Document 1 (Japanese Unexamined Patent Publication No. 2010-21575) describes the following method for manufacturing a porous insulation film: to the vapor obtained by diluting the vapor of a cyclic organic silica compound (cyclic organic siloxane raw material) with an inert gas, is added an oxidant gas at a flow rate 0.3 time or more and 1.2 times or less the flow rate of the cyclic silica compound, and the mixture is introduced into a plasma to grow a porous insulation film. It is considered that this method can provide an insulation film with a low relative dielectric constant with stability.

Patent Document 2 (WO2007/032261) describes the following method: using a mixed gas of a cyclic organic siloxane raw material, and a compound raw material including a part of the chemical structure forming the cyclic organic siloxane raw material, a porous insulation film is formed by a plasma vapor deposition method. It is considered that this method can provide a porous insulation film suppressed in elimination of hydrocarbon.

Patent Document 3 (WO2008/010591) describes the following method for forming an insulation film. There are used a raw material having a 3-membered cyclic SiO structure in the main skeleton, and a raw material having a 4-membered cyclic SiO structure in the main skeleton. At least one of the two kinds of raw materials has at least one or more unsaturated hydrocarbon groups in the side chain. It is considered that this method can provide a porous insulation film implementing high strength and high density.

Patent Document 4 (Japanese Unexamined Patent Publication No. 2011-192962) describes the following method for manufacturing a semiconductor device. First, two or more organic siloxane compound raw materials each having a cyclic SiO structure in a main skeleton thereof, and having mutually different structures are mixed to be vaporized. Then, using the vaporized gas in a reactor, a porous insulation film is formed by a plasma CVD (Chemical Vapor Deposition) method or a plasma polymerization method. It is considered that this method can reduce the relative dielectric constant of the insulation film with ease.

PATENT DOCUMENTS

[Patent Document 1]
Japanese Unexamined Patent Publication No. 2010-21575
[Patent Document 2]
WO2007/032261
[Patent Document 3]
WO2008/010591
[Patent Document 4]
Japanese Unexamined Patent Publication No. 2011-192962

SUMMARY

In recent years, there has been a further demand for an increase in deposition rate of a porous insulation film. The present inventors found it difficult to implement an increase in deposition rate of the porous insulation film, and an improvement of the film strength of the porous insulation film. Other problems and novel features will be apparent from the description of this specification and the accompanying drawings.

In accordance with one embodiment, a method for manufacturing a porous insulation film has the following feature. Two or more organic siloxane raw materials each having a cyclic SiO structure as a main skeleton thereof, and having mutually different structures are vaporized. The vaporized raw materials are transported with a carrier gas to a reactor. An oxidant gas including an oxygen atom is added thereto. By a plasma CVD (Chemical Vapor Deposition) method or a plasma polymerization method, a porous insulation film is formed in the reactor. In the step, the ratio of the flow rate of the added oxidant gas to the flow rate of the carrier gas is more than 0 and 0.08 or less.

In accordance with one embodiment, a porous insulation film has the following feature. The porous insulation film includes: Si, O, C and H, a cyclic SiO structure, and an unsaturated hydrocarbon group and a branched hydrocarbon group bonded to Si. Further, the peak area ratio of the peak of CHx in the vicinity of a wave number of 2900 $cm^{-1}$ to the peak of —Si—O—Si— in the vicinity of a wave number of 1100 $cm^{-1}$ determined by a FTIR (Fourier Transform Infrared Spectroscopy) method is 0.23 or more.

In accordance with one embodiment, a method for manufacturing a semiconductor device has the following feature. Two or more organic siloxane raw materials each having a cyclic SiO structure as a main skeleton thereof, and having mutually different structures are vaporized. The vaporized raw materials are transported with a carrier gas to a reactor. An oxidant gas including an oxygen atom is added thereto. By a plasma CVD (Chemical Vapor Deposition) method or a plasma polymerization method, a porous insulation film is formed in the reactor (porous insulation film formation step). In the porous insulation film formation step, the ratio of the flow rate of the added oxidant gas to the flow rate of the carrier gas is more than 0 and 0.08 or less.

In accordance with one embodiment, a semiconductor device, includes: a porous insulation film including Si, O, C and H, a cyclic SiO structure, and an unsaturated hydrocarbon group and a branched hydrocarbon group bonded to Si, and a wire or a via disposed in the porous insulation film. Further, the peak area ratio of the peak of CHx in the vicinity of a wave number of 2900 $cm^{-1}$ to the peak of —Si—O—Si— in the vicinity of a wave number of 1100 $cm^{-1}$ determined by a FTIR (Fourier Transform Infrared Spectroscopy) method of the porous insulation film is 0.23 or more.

In accordance with the one embodiment, it is possible to increase the deposition rate of a porous insulation film, and improve the film strength of the porous insulation film while keeping the relative dielectric constant.

DETAILED DESCRIPTION

Figure 1:
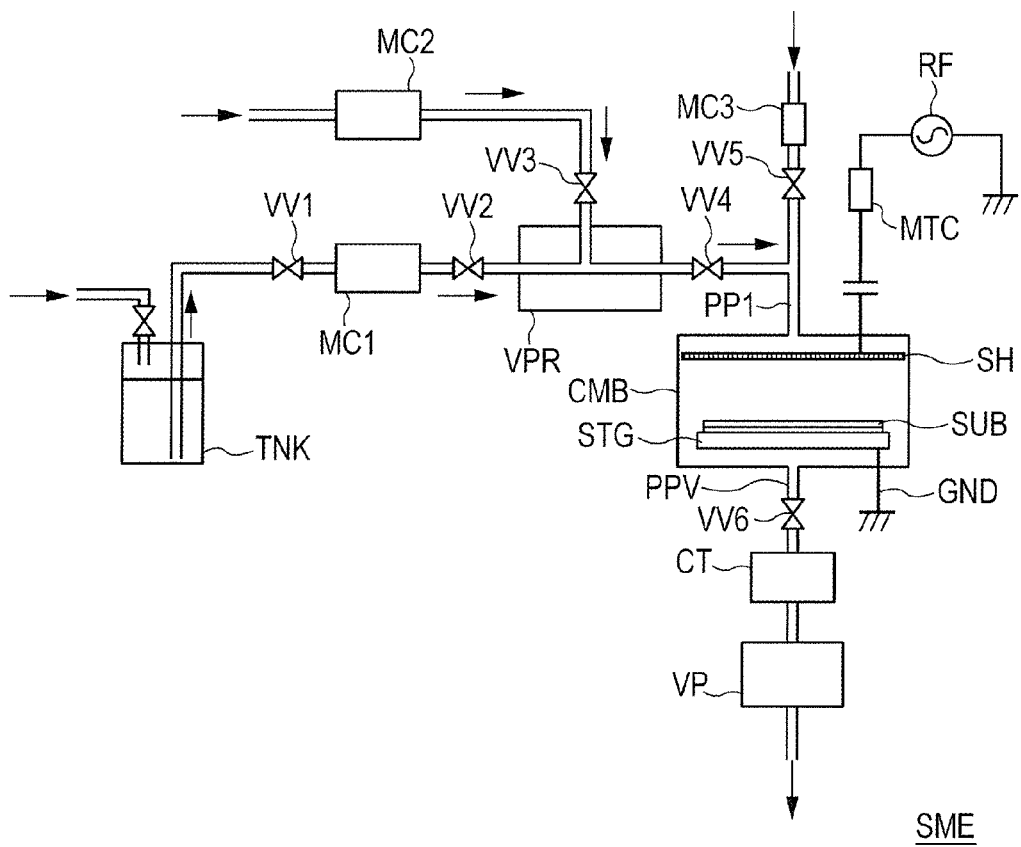
FIG. 1 is a schematic view showing a configuration of a semiconductor manufacturing device in accordance with First Embodiment.

Below, embodiments of the present invention will be described by reference to the accompanying drawings. Incidentally, throughout all the drawings, the same structural elements are given the same reference numerals and signs, and a description thereon is appropriately omitted.

First Embodiment

With a method for manufacturing a porous insulation film and a method for manufacturing a semiconductor device SD of First Embodiment, two or more organic siloxane raw materials each having a cyclic SiO structure as a main skeleton thereof, and having mutually different structures are vaporized to be transported with a carrier gas to a reactor (chamber CMB). An oxidant gas including an oxygen atom is added thereto. Thus, in the reactor (chamber CMB), a porous insulation film is formed by a plasma CVD (Chemical Vapor Deposition) method or a plasma polymerization method (porous insulation film formation step). In the porous insulation film formation step, the ratio of the flow rate of the added oxidant gas to the flow rate of the carrier gas is more than 0 and 0.08 or less. As a result, it is possible to increase the deposition rate of the porous insulation film, and it is possible to improve the film strength of the porous insulation film.

(Porous Insulation Film Manufacturing Device or Semiconductor Manufacturing Device)

First, referring to FIG. 1, a description will be given to a semiconductor manufacturing device SME in accordance with First Embodiment. FIG. 1 is a schematic view showing a configuration of the semiconductor manufacturing device SME in accordance with First Embodiment. The semiconductor device SD in accordance with First Embodiment is manufactured using the following semiconductor manufacturing device SME. The semiconductor manufacturing device SME is a device for forming a porous insulation film by, for example, a plasma CVD method or a plasma polymerization method. Incidentally, the term "semiconductor manufacturing device SME" herein used is not limited to a semiconductor device, but may be a porous insulation film manufacturing device for forming a monolayer porous insulation film.

As shown in FIG. 1, the reactor (chamber CMB) is coupled via an exhaust pipe PPV, an exhaust valve VV6, and a cooling trap CT to a vacuum pump VP. As a result, by operating the vacuum pump VP, it is possible to reduce the pressure in the chamber CMB.

Further, between the chamber CMB and the vacuum pump VP, there is provided a throttle valve (not shown). By controlling the opening degree of the throttle valve, it is possible to control the pressure in the chamber CMB.

In the inside of the chamber CMB, there is disposed a stage STG having a heating function. Over the stage STG, there is mounted a substrate targeted for deposition (e.g., semiconductor substrate SUB). The stage STG can be heated.

The organic siloxane raw materials for use in First Embodiment are sealed each in a liquid state in a raw material reservoir tank TNK. In the raw material reservoir tank TNK, there are mixed, for example, two kinds of organic siloxane raw materials described later. Incidentally, raw material reservoir tanks TNK may be individually provided for respective organic siloxane raw materials. In this case, the pipes for feeding the raw materials, and the like may be individually provided for respective raw materials. The structures of the organic siloxane raw materials and the like will be described in details later.

The raw materials (organic siloxane raw materials) are pressure fed by an inert gas from the raw material reservoir tank TNK through a pipe (reference sign not shown). Then, the raw materials are introduced via a valve VV1, a liquid flow rate controller MC1, and a valve VV2 in this order into a vaporizer VPR. The flow rate of the raw materials to be introduced into the vaporizer VPR is adjusted to a desired flow rate by the liquid flow rate controller MC1. The inert gas for use in pressure feeding of the raw materials is, for example, He, Ar, Ne, Xe or $N_2$.

The raw materials are reduced in pressure, and heated, thereby to be vaporized in the vaporizer VPR. The vaporized raw material gases are fed via a valve VV4 and a pipe PP1 into the chamber CMB. The pipe PP1 is heated by, for example, a heater (not shown). This suppresses the reliquefaction of the vaporized raw material gases.

Further, in the vaporizer VPR, the flow rate of the carrier gas flowed into the vaporizer VPR, and the vaporization temperature in the vaporizer VPR are controlled so that the pressure is lower than the saturated vapor pressure upon vaporization of the raw materials. As a result, even when respective boiling points and saturated vapor pressures of two or more organic siloxane raw materials are different from each other, the raw materials can be vaporized unbiasedly. Therefore, it is possible to obtain vaporized gases still kept in mixing ratio in the raw material reservoir tank TNK.

The pipe for carrier gas (reference sign not shown) is coupled via the gas flow rate controller MC2 and the valve VV3 to the vaporizer VPR. The carrier gas transports, in the vaporizer VPR, the raw material gases via the valve VV4 and the pipe PP1 into the chamber CMB. The flow rate of the carrier gas is adjusted to a desired flow rate by the gas flow rate controller MC2. The carrier gas is, for example, He, Ar, Ne, Xe, or $N_2$.

In First Embodiment, a pipe for oxidant gas (reference sign not shown) is coupled via the gas flow rate controller MC3 and the valve VV5 to the chamber CMB. As a result, in addition to the raw material gases and the carrier gas, an oxidant gas can be fed to the chamber CMB. The oxidant gas includes at least one or more of $O_2$, $CO_2$, CO, $N_2O$, or $NO_2$. In other words, the oxidant gas is, for example, $O_2$, $CO_2$, CO, $N_2O$, or $NO_2$, or a mixed gas thereof.

In the chamber CMB, there is disposed a shower head SH having a plurality of through holes. As a result, the raw material gases, the carrier gas, and the oxidant gas introduced into the chamber CMB are dispersed by the shower head SH.

To the shower head SH, there is coupled a high frequency power source RF via a feeder line (reference sign not shown) and a matching controller MTC. As a result, a high frequency power is fed between the shower head SH and the stage STG. Incidentally, the high frequency power source RF may be coupled to the stage STG side. The term "high frequency" herein used denotes a frequency of 1 MHz or more. Specifically, the high frequency is 13.56 MHz or a multiplied wave thereof. Alternatively, other than the high frequency power source RF, a low frequency power source (not shown) may be coupled thereto. The low frequency power source is coupled to anyone of the shower head SH or the stage STG.

The raw material gases, the carrier gas, and the oxidant gas are introduced via the pipe PP1 into the chamber CMB. The gases are turned into a plasma by the voltage applied across the shower head SH and the stage STG. As a result, over the semiconductor substrate SUB mounted over the stage STG, there can be formed a porous insulation film (PF1 or PF2 described later).

Incidentally, for cleaning of the chamber CMB, there can be used a gas such as nitrogen trifluoride ($NF_3$), sulfur hexafluoride ($SF_6$), tetrafluoromethane ($CF_4$), or hexafluoroethane ($C_2F_6$). The gases may be, if required, used as a mixed gas with oxygen, ozone, or the like.

(Organic Siloxane Raw Material)

Then, a description will be given to the organic siloxane raw materials for use in First Embodiment. In First Embodiment, there are used two or more organic siloxane raw materials each having a cyclic SiO structure in a main skeleton thereof, and having mutually different structures. Below, the cyclic SiO structure of the main skeleton will be referred to as a "cyclic siloxane skeleton".

The organic siloxane raw material has a cyclic organic silica skeleton represented by the following chemical formula (1):

[Chemical formula 1]

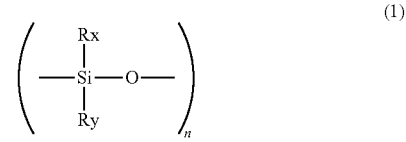

where, in the chemical formula (1), n is 2 to 5, Rx and Ry are each any of hydrogen, an unsaturated hydrocarbon group, and a saturated hydrocarbon group, and the unsaturated hydrocarbon group and the saturated hydrocarbon group are each any of a vinyl group, an allyl group, a methyl group, an ethyl group, a propyl group, an isopropyl group, a butyl group, and a tertiary butyl group.

By using such an organic siloxane raw material, it is possible to form independent pores (closed pores) in the porous insulation film by the cyclic SiO structures of the raw materials. Therefore, it is possible to form a porous insulation film having a uniform film density distribution. For example, by changing n in the chemical formula (1), it is possible to control the pore size. Namely, it is possible to control the relative dielectric constant of the porous insulation film.

For example, at least two organic siloxane raw materials are different in n from each other. The cyclic organic siloxane skeleton of a first organic siloxane raw material of the at least two organic siloxane raw materials is smaller than the cyclic siloxane skeleton of the second organic siloxane raw material. In other words, the bond energy of the cyclic organic siloxane skeleton of the first organic siloxane raw material is stronger than the bond energy of the cyclic siloxane skeleton of the second organic siloxane raw material. As a result, in a porous insulation film formation step described later, the second organic siloxane raw material having a cyclic siloxane skeleton with a weak bond energy is preferentially dissociated. In this step, some of the dissociated Si—O bonds link the molecules of the first organic siloxane raw materials. Namely, the first organic siloxane raw material can form a strong network via Si—O bonds. Therefore, it is possible to improve the film strength of the porous insulation film.

For example, in at least one organic siloxane raw material, n is 3. In other words, at least one organic siloxane raw material includes a 6-membered cyclic organic siloxane skeleton. As a result, it is possible to form a porous insulation film having an average pore diameter of 1 nm or less.

Further, preferably, in the at least two organic siloxane raw materials, one n is 3, and the other n is 4. In other words, in the at least two organic siloxane raw materials, one (the first organic siloxane raw material) includes a 6-membered cyclic organic siloxane skeleton. The other (the second organic siloxane raw material) includes a 8-membered cyclic siloxane skeleton. As a result, the mechanism can more improve the film strength of the porous insulation film than when a single organic siloxane raw material is used. Further, an organic siloxane raw material with an n of 3 or 4 is easy to manufacture, and is often chemically stable, and hence is particularly preferable. Further, the thus mixed raw materials are higher in polymerization temperature than a single raw material, and hence is stable to heat.

Further, for example, at least one organic siloxane raw material has an unsaturated hydrocarbon group. In the chemical formula (1), Rx or Ry is an unsaturated hydrocarbon group. In this case, in a porous insulation film formation step, in a plasma, the unsaturated hydrocarbon group is ring-opened, so that a polymerization reaction proceeds between molecules of the organic siloxane raw material. As a result, a crosslinking structure can be formed between molecules of the organic siloxane raw material with ease.

In the chemical formula (1), for Rx and Ry, there is preferably used at least one of a straight-chain unsaturated hydrocarbon group having 2 to 4 carbon atoms, or a branched chain saturated hydrocarbon group having 3 to 4 carbon atoms.

Specific examples thereof may include a trivinylcyclotrisiloxane derivative represented by the following chemical formula (2), or a tetravinylcyclotetrasiloxane derivative represented by the following chemical formula (3):

[Chemical formula 2]

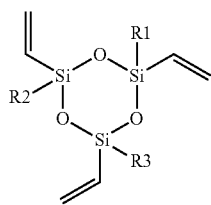

(2)

[Chemical formula 3]

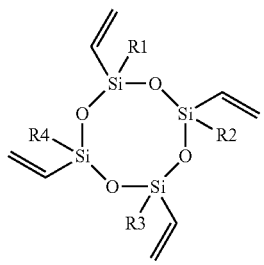

(3)

where, in the chemical formula (2) or (3), $R_1$, $R_2$, $R_3$, and $R_4$ are each any of hydrogen, an unsaturated hydrocarbon group, and a saturated hydrocarbon group; further, each of the unsaturated hydrocarbon group and the saturated hydrocarbon group is any of a vinyl group, an allyl group, a methyl group, an ethyl group, a propyl group, an isopropyl group, and a butyl group.

(Semiconductor Device)

Figure 2:
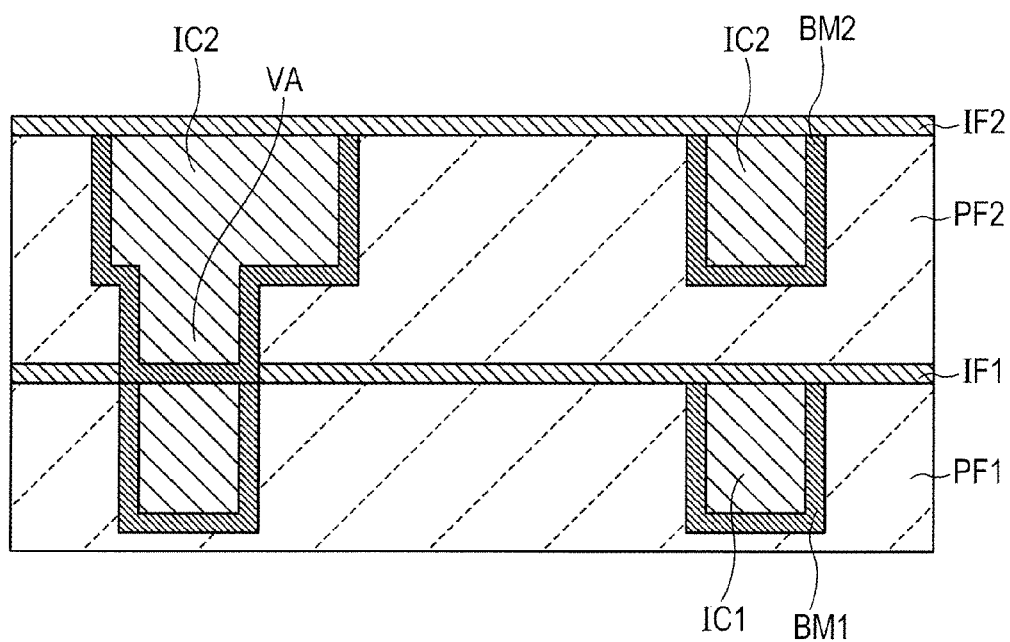
FIG. 2 is a cross-sectional view showing a configuration of a semiconductor device in accordance with First Embodiment.

Then, referring to FIG. 2, a description will be given to the whole structure of the semiconductor device SD in accordance with First Embodiment. FIG. 2 is a cross-sectional view showing a configuration of the semiconductor device SD in accordance with First Embodiment. The semiconductor device SD of First Embodiment includes a porous insulation film (PF1 or PF2). Herein, for example, there are stacked a plurality of porous insulation films (the porous insulation film PF1 and the porous insulation film PF2).

The porous insulation film PF1 is disposed over, for example, a substrate (not shown). The substrate may be any member capable of mechanically supporting the porous insulation film PF1. The substrate is, for example, a semiconductor substrate. Specifically, the substrate is a silicon substrate.

Other than these, the substrate may be a metal substrate, an insulation substrate, or a composite material thereof. Specifically, the metal substrate is, for example, Au, Cu, Ti, or Fe, or an alloy including each thereof. Further, the insulation substrate may be glass ($SiO_2$), polymer resin, plastic, or silicon resin, or a composite material thereof. Alternatively, the substrate may be formed of a semiconductor substrate and an insulation substrate. Specifically, mention may be made of a SOI (Silicon On Insulator) substrate. Other than these, the porous insulation film PF1 itself may form a substrate.

In the porous insulation film PF1, there are disposed, for example, a plurality of wires IC1. The wire IC1 includes, for example, Cu as a main component. The wire IC1 may include other metal elements than Cu. Other than these, the wire IC1 may be W or Al, or an alloy thereof, or the like.

At the side surface and the bottom surface of the wire IC1, there is disposed a barrier metal BM1. When the wire IC1 includes Cu, the barrier metal BM1 is formed of, for example, Ti, Ta, W, or Ru, or nitride or carbonitride thereof.

Over the porous insulation film PF1, there is disposed a barrier insulation film IF1. The barrier insulation film IF has a function of preventing the oxidation of Cu, or the diffusion of Cu into the insulation film, and a function as an etching stopper layer for processing the porous insulation film PF1, or the like. The barrier insulation film IF1 is, for example, a SiC film, a SiCN film, a SiN film, a BN film, or a BCN film. Incidentally, the barrier insulation film IF1 is not indispensable.

Alternatively, over the wire IC1, a metal cap layer (not shown) may be disposed. The metal cap layer may be formed of, for example, CoWP, CoWB, CoSnP, CoSnB, NiB, or NiMoB.

Over the barrier insulation film IF1, there is disposed the porous insulation film PF2. The porous insulation film PF 2 is formed in the same manner as with, for example, the porous insulation film PF1.

In the porous insulation film PF2, for example, by a dual damascene method, there are disposed a via VA and a wire IC2. The wire IC2 is coupled to the wire IC1 situated in the underlying layer via the via VA. The via VA and the wire IC2 are formed of, for example, the same material as that for the wire IC1. In respective wiring layers, wires or vias may be formed of different metals.

Further, at the side surface and the bottom surface of the via VA, and the side surface and the bottom surface of the wire IC2, there is disposed a barrier metal BM2. The barrier metal BM2 is formed of, for example, the same material as that for barrier metal BM1.

Over the porous insulation film PF2, there is disposed a barrier insulation film IF2. The barrier insulation film IF is formed of, for example, the same material as that for the barrier insulation film IF1.

Over the barrier insulation film IF2, there may be further formed a multilayered porous insulation film.

(Method for Manufacturing a Porous Insulation Film and a Semiconductor Device)

Then, referring to FIGS. 3A and 3B to 6, a description will be given to a method for manufacturing the semiconductor device SD in accordance with First Embodiment. FIGS. 3A and 3B to 6 are each a cross-sectional view for illustrating the method for manufacturing the semiconductor device SD in accordance with First Embodiment. Below, the details will be described.

Figure 3A:
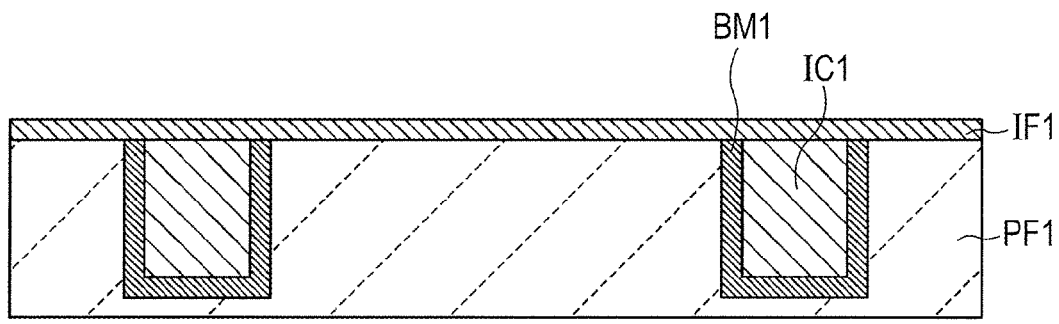
FIGS. 3A and 3B are each a cross-sectional view for illustrating a method for manufacturing the semiconductor device in accordance with First Embodiment.

As shown in FIG. 3A, over a substrate (not shown), there is formed a porous insulation film PF1. The porous insulation film PF1 is formed, for example, in the same manner as with a porous insulation film PF2 described later. Then, in the porous insulation film PF1, there are formed a plurality of wire trenches (reference sign not shown). Then, at the side surface and the bottom surface of the wire IC1, there is formed a barrier metal BM1. Then, in the wire trenches, there is formed a metal film (reference sign not shown). Then, by a CMP (Chemical Mechanical Polishing) method, the metal film is polished, so that the metal is embedded in the wire trenches. As a result, the wire IC1 is formed in the porous insulation film PF1. Then, over the porous insulation film PF1, there is formed a barrier insulation film IF1.

Figure 3B:
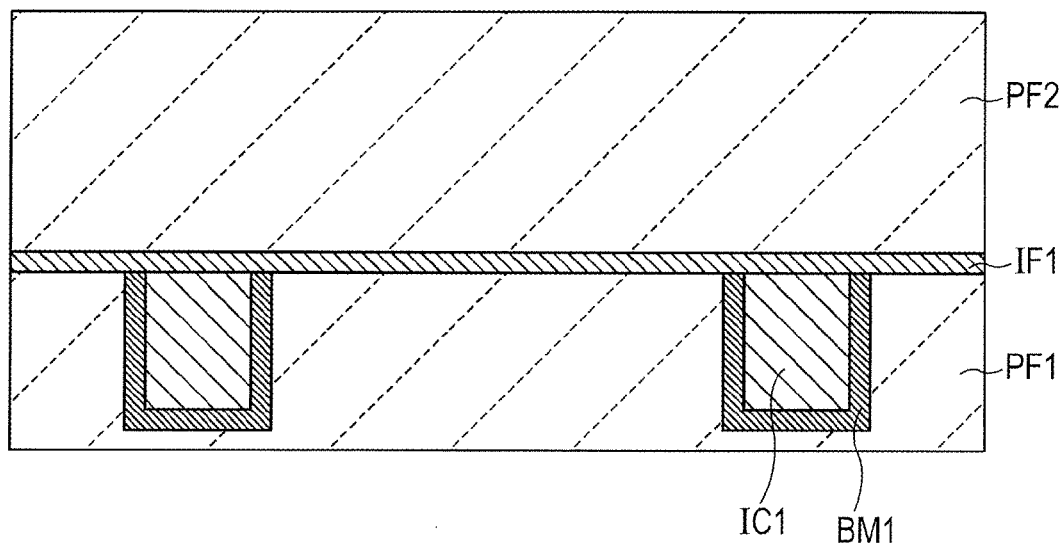

As shown in FIG. 3B, over the barrier insulation film PF1, using a hydrocarbon-containing organic siloxane raw material, the porous insulation film PF2 is formed over the barrier insulation film IF1 (porous insulation film formation step).

In this step, two or more organic siloxane raw materials each having a cyclic SiO structure as a main skeleton thereof, and having mutually different structures are vaporized to be transported with a carrier gas into the chamber CMB. At this step, an oxidant gas including an oxygen atom is added thereto. Then, in the chamber CMB, by a plasma CVD method or a plasma polymerization method, the porous insulation film PF2 is formed.

The organic siloxane raw material has a cyclic organic siloxane skeleton. This allows the cyclic SiO structure to be taken as a pore into the porous insulation film PF2. In the porous insulation film PF2, a pore equivalent to the diameter of the cyclic SiO structure is formed. Therefore, pores can be finely and uniformly introduced into the porous insulation film PF2.

Further, as described above, the oxidant gas includes any one or more of $O_2$, $CO_2$, CO, $N_2O$, or $NO_2$. As the oxidant gas, $H_2O$ can also be considered. However, use of $H_2O$ results in the formation of a Si—OH group in the porous insulation film PF2. In this case, the relative dielectric constant of the porous insulation film increases. Therefore, by using the foregoing gases as the oxidant gases, it is possible to increase the deposition rate without increasing the relative dielectric constant.

In the porous insulation film formation step, the ratio of the flow rate of the added oxidant gas to the flow rate of the carrier gas is more than 0 and 0.08 or less. The ratio of the oxidant gas flow rate to the carrier gas flow rate is equal to, or larger than the lower limit value. This can make the deposition rate higher than that when the oxidant gas is not added. Incidentally, the lower limit value of the ratio of the added oxidant gas flow rate to the carrier gas flow rate is larger than the ratio of the flow rate of a gas including oxygen resulting from unintended mixing into the chamber CMB (so-called contamination). Further, the ratio of the oxidant gas flow rate to the carrier gas flow rate is equal to, or lower than the higher limit value. This can more improve the film strength of the porous insulation film than that when only one organic siloxane raw material is used. The relationship between the ratio of the oxidant gas flow rate to the carrier gas flow rate and the deposition rate and the film strength of the porous insulation film will be described in details later.

Incidentally, the carrier gas flow rate is preferably 1 time to 100 times or less the liquid flow rate of the organic siloxane raw material. As a result, the organic siloxane raw material can be transported into the chamber CMB without liquefaction.

Further, the ratio of the flow rate of the added oxidant gas to the flow rate of the organic siloxane raw material is 0.1 or more and 5 or less. The term "flow rate of the organic siloxane raw material" herein used is the gas flow rate when the organic siloxane raw material is vaporized. Incidentally, the number of moles of the organic siloxane raw material per unit time can be determined from the mixing ratio in the raw material reservoir tank TNK, and the liquid flow rate in the liquid flow rate controller MC1. As with the ratio of the oxidant gas flow rate to the carrier gas flow rate, the ratio of the oxidant gas flow rate to the organic siloxane raw material flow rate falls within the foregoing range. As a result, it is possible to increase the deposition rate of the porous insulation film, and it is possible to improve the film strength.

For example, when two organic siloxane raw materials are used, the mixing ratio of the first organic siloxane raw material and the second organic siloxane raw material is 1:9 to 9:1.

In the porous insulation film formation step, the atmosphere pressure in the chamber CMB is set within the range of, for example, 1 Torr or more and 6 Torr or less by the vacuum pump VP. Further, the partial pressure of the gas of the organic siloxane raw material in the chamber CMB is preferably 0.1 Torr or more and 3 Torr or less.

Further, in the porous insulation film formation step, the stage STG is heated, thereby to heat the substrate SUB to 100° C. or more and 400° C. or less. Preferably, the substrate SUB is heated to 250° C. or more and 400° C. or less. By heating the substrate SUB within the temperature range, a plasma polymerization reaction is promoted at the interface between the film situated at the underlying layer and the porous insulation film PF2. As a result, it is possible to improve the adhesion of the porous insulation film PF2.

Then, after the porous insulation film formation step, a light with a wavelength of 400 nm or less or an electron beam may be applied to the porous insulation film PF2. When an electron beam is applied, preferably, the acceleration energy of the electron beam is 1 keV or more and 30 keV or less, and the dose amount thereof is 0.05 mC/cm$^2$ or more and 1.0 mC/cm$^2$ or less. Alternatively, when a light with a wavelength of 400 nm or less is applied thereto, the exposure time of the light is preferably 10 sec or more and 5 min or less. The light with a wavelength of 400 nm or less may be a single-wavelength light having a line spectrum, or a broad light having a broadband, or a combined light thereof. In the step, the substrate SUB may be heated simultaneously.

Figure 4A:
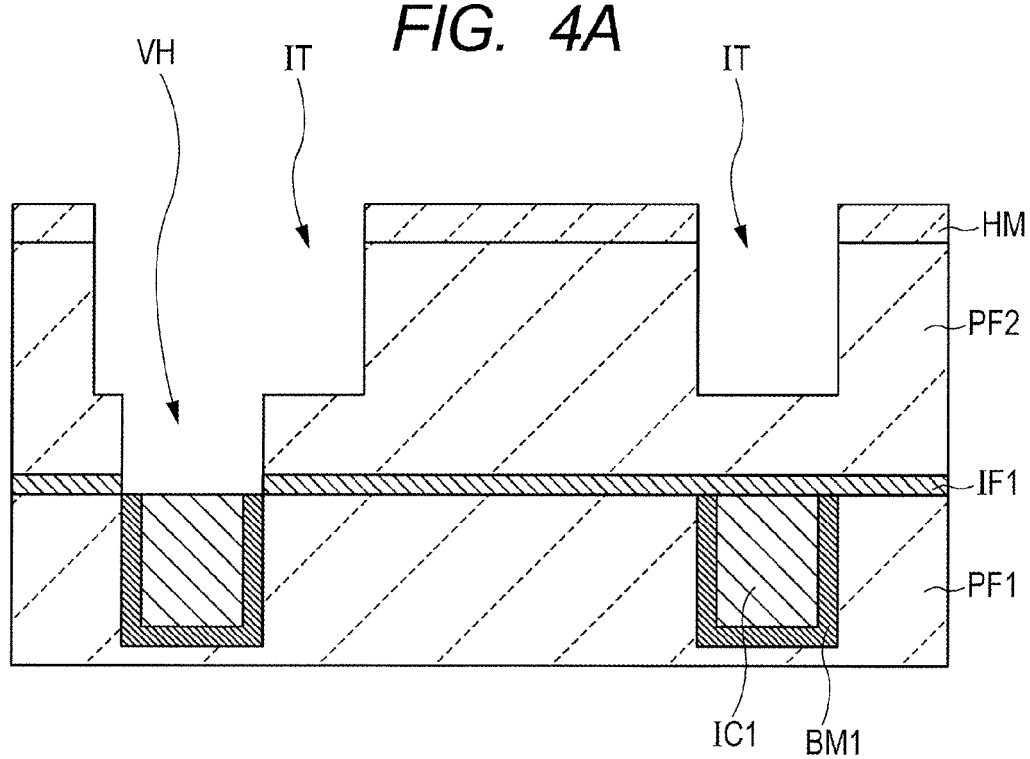
FIGS. 4A and 4B are each a cross-sectional view for illustrating a method for manufacturing the semiconductor device in accordance with First Embodiment.

Then, as shown in FIG. 4A, over the porous insulation film PF2, there is formed a hard mask HM. The hard mask HM protects the porous insulation film PF2 in a step of forming trenches or via holes. The hard mask HM is, for example, $SiO_2$, TEOS, or SiOC or SiOCH (with a modulus of 10 GPa or more) harder than the porous insulation film PF2. The hard mask HM is not indispensable.

Then, for example, by a RIE (Reactive Ion Etching) method, the porous insulation film PF2 is selectively removed. As a result, in the porous insulation film PF2, there are formed trenches IT and a via hole VH. This step may be any of a via first method or a trench first method.

Figure 4B:
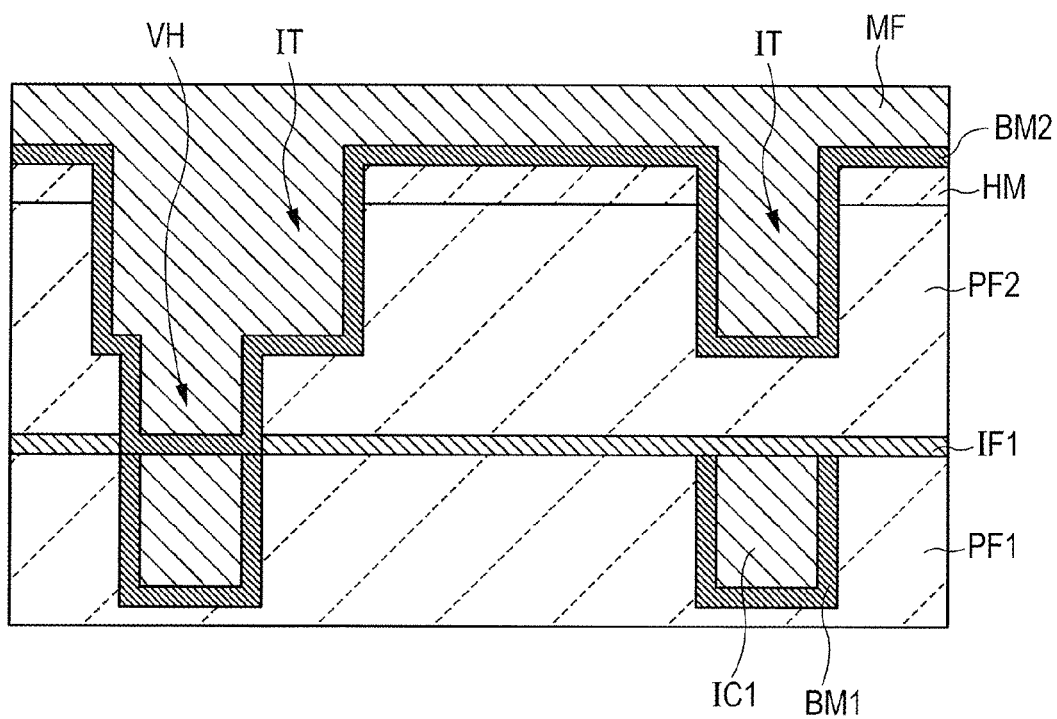

Then, as shown in FIG. 4B, at the side surfaces and the bottom surfaces of the trenches IT and the via hole VH, there is formed a barrier metal BM2. The barrier metal BM2 is formed of, for example, the same material as that for the barrier metal BM1. For example, by sputtering, as the barrier metal BM2, there is formed, for example, Ti, Ta, W, or Ru, or a nitride or carbonitride thereof.

Then, for example, by a plating method, a metal film MF is formed in the trenches IT and the via hole VH. The metal film MF is, for example, Cu.

Then, a heat treatment is performed for Cu grain growth. For example, the temperature in the heat treatment is 200° C. or more and 400° C. or less, and the heat treatment time is 30 sec or more and 1 hour or less.

Figure 5A:
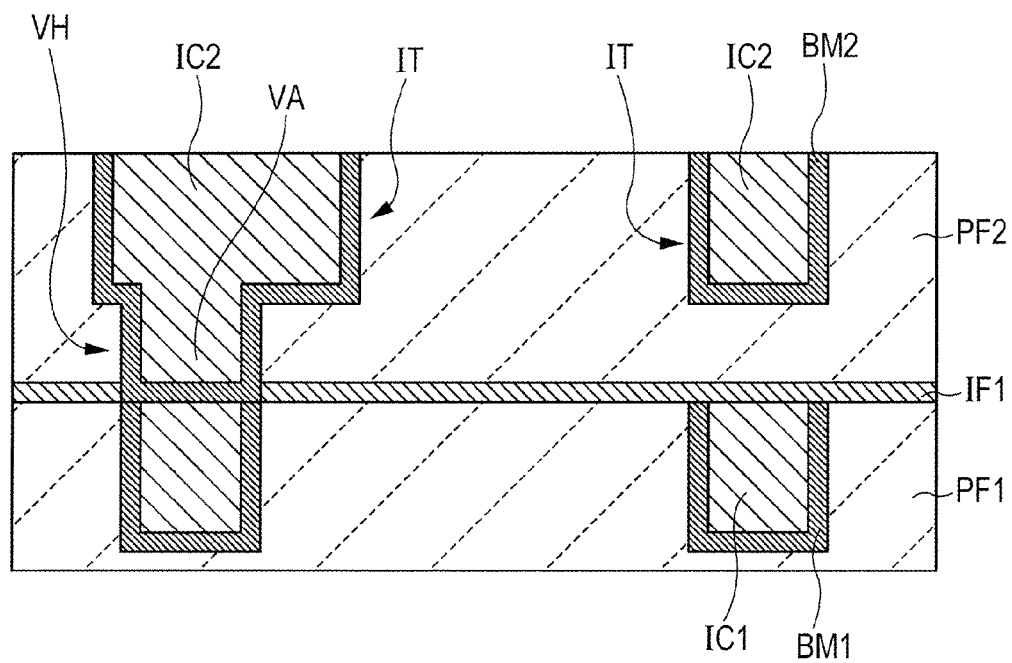
FIGS. 5A and 5B are each a cross-sectional view for illustrating a method for manufacturing the semiconductor device in accordance with First Embodiment.

Then, as shown in FIG. 5A, by a CMP method, the metal film MF is polished, so that the metal is embedded in the trenches IT and the via hole VH. As a result, in the porous insulation film PF2, there are formed wires IC2 and a via VA. At this step, the hard mask HM may be removed. Further, the surface layer of the porous insulation film PF2 may be removed.

Figure 5B:
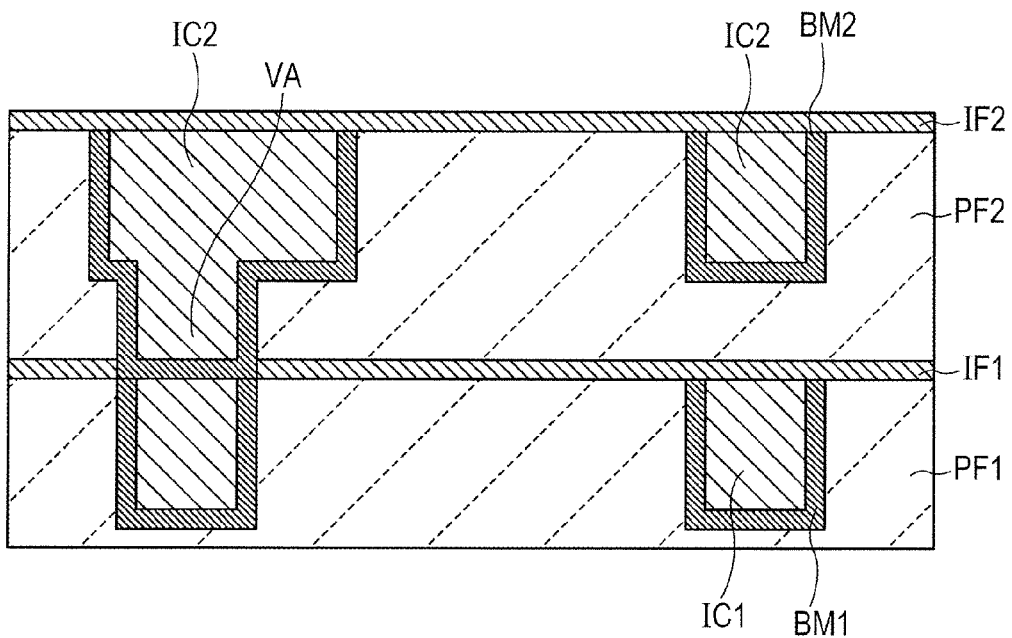

Then, as shown in FIG. 5B, over the porous insulation film PF2, there is formed a barrier insulation film IF2. The barrier insulation film IF2 is formed of, for example, the same material as that for the barrier insulation film IF1. As the barrier insulation film IF2, there is formed, for example, a SiC film, a SiCN film, a SiN film, a BN film or a BCN film.

Over the porous insulation film PF2, there may be further formed a plurality of porous insulation films. By the steps up to this point, it is possible to obtain the semiconductor device SD in accordance with First Embodiment.

EXAMPLES

Then, specific examples will be described. In this example, using two organic siloxane raw materials, there was deposited a one-layer porous insulation film. In the example, there were used a first organic siloxane raw material represented by the chemical formula (1), where n is 3, Rx is a vinyl group, and Ry is an isopropyl group, and a second organic siloxane raw material represented by the chemical formula (1), where n is 4, Rx is a vinyl group, and Ry is a methyl group. The mixing ratio of the first and second organic siloxane raw materials is 4:3.

In the porous insulation film formation step, He was used as a carrier gas. The flow rate of the carrier gas was changed within the range of 300 sccm or more and 2000 sccm or less. $N_2O$ was used as an oxidant gas. The flow rate of the oxidant gas was changed within the range of 12 sccm or more and 80 sccm or less.

For deposition, a high frequency of 13.56 MHz was used. The applied electric power was 25 W or more and 500 W or less. The applied electric power also depends upon the inter-electrode distance and the electrode area. For this reason, the applied electric power can be freely adjusted by the semiconductor manufacturing device SME, and is not limited to the foregoing range. Alternatively even when a low frequency of 400 to 500 kHz is applied together with a high frequency of 13.56 MHz, the same results can be obtained.

Comparative Example

In Comparative Example, using only one organic siloxane raw material, there was deposited a one-layer porous insulation film. In Comparative Example, there was used only a (first) organic siloxane raw material represented by the chemical formula (1), where n is 3, Rx is a vinyl group, and Ry is an isopropyl group.

(Results)

Then, referring to FIGS. 6 to 9, a description will be given to the advantageous effects of First Embodiment together with the results of Example.

Figure 6:
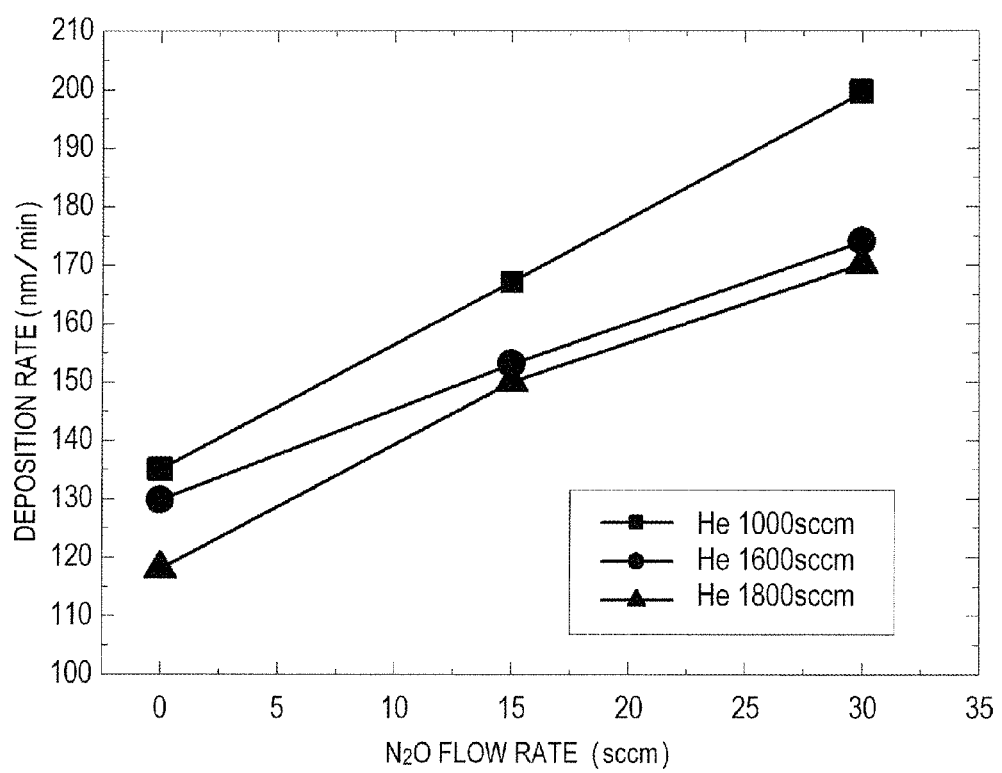
FIG. 6 is a view showing the relationship between the flow rate of an oxidant gas and the deposition rate of a porous insulation film.

FIG. 6 is a view showing the relationship between the flow rate of an oxidant gas and the deposition rate of the porous insulation film in Example. FIG. 6 shows the deposition rates when the flow rates of He which is a carrier gas are 1000 sccm, 1600 sccm, and 1800 sccm, respectively. As shown in FIG. 6, with an increase in flow rate of $N_2O$ which is an oxidant gas, the deposition rate of the porous insulation film increases. Incidentally, other oxidant gases than $N_2O$ also show the same tendency.

Figure 7:
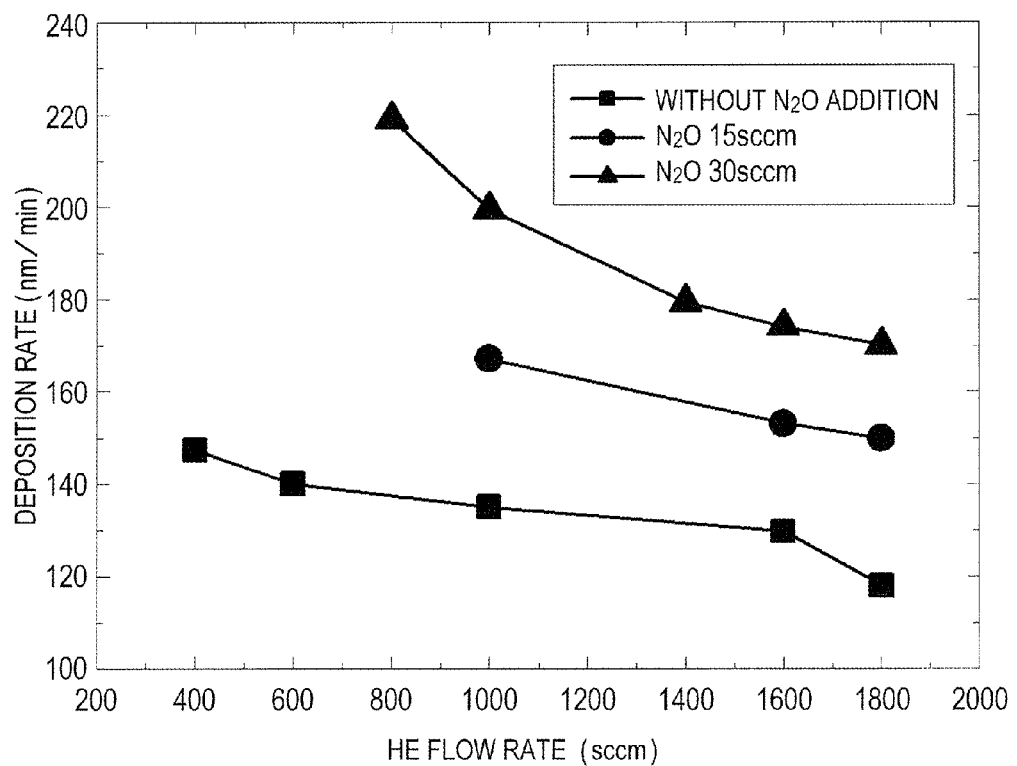
FIG. 7 is a view showing the relationship between the flow rate of a carrier gas and the deposition rate of the porous insulation film.

FIG. 7 is a view showing the relationship between the flow rate of the carrier gas and the deposition rate of the porous insulation film in Example. FIG. 7 shows the deposition rates when the flow rates of $N_2O$ which is an oxidant gas are 0 sccm (without addition), 15 sccm, and 30 sccm, respectively. As shown in FIG. 7, with an increase in flow rate of He which is a carrier gas, the deposition rate of the porous insulation film decreases. This is because the organic siloxane raw material is diluted with the carrier gas.

Figure 8:
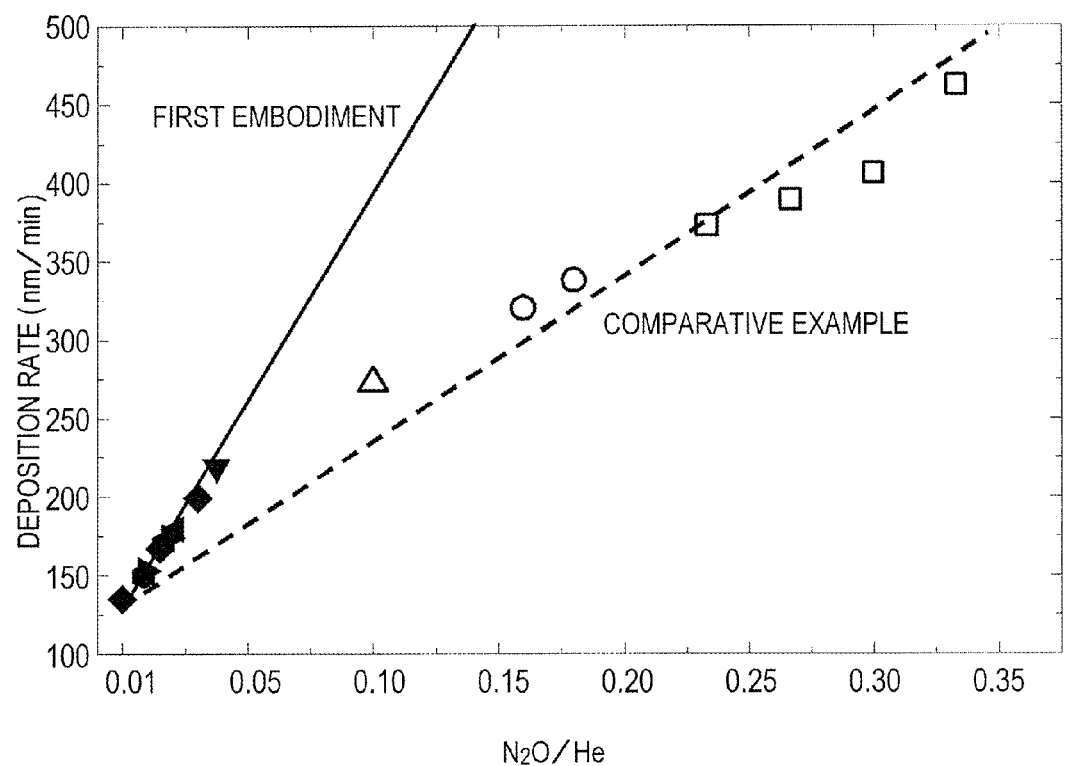
FIG. 8 is a view showing the relationship between the ratio of the oxidant gas flow rate to the carrier gas flow rate and the deposition rate of the porous insulation film.

FIG. 8 is a view showing the relationship between the ratio of the oxidant gas flow rate to the carrier gas flow rate and the deposition rate of the porous insulation film. The horizontal axis in FIG. 8 denotes the flow rate ratio ($N_2O$/He) of the oxidant gas ($N_2O$) to the carrier gas (He). Further, in FIG. 8, plotting is also made for Comparative Example.

As shown in FIG. 8, in Comparative Example and Example, with an increase in ratio of the oxidant gas flow rate to the carrier gas flow rate, the deposition rate of the porous insulation film increases. Further, in FIG. 8, the slope for Example is sharper than the slope for Comparative Example. This indicates that Example is more effective in increasing the deposition rate with respect to addition of $N_2O$.

The tendency on the deposition rate of FIG. 8 is the same even when the ratio of the first organic siloxane raw material in which n is 3 and the second organic siloxane raw material in which n is 4 is a ratio other than 4:3. Incidentally, when the ratio of the first and second organic siloxane raw materials is 4:3, the slope of the deposition rate relative to the ratio of the oxidant gas flow rate to the carrier gas flow rate is the largest.

Further, the tendency is not limited to the case where the first organic siloxane raw material in which n is 3 and the second organic siloxane raw material in which n is 4 are mixed. Namely, even for combinations of other organic siloxane raw materials, mixing of two or more organic siloxane raw materials having mutually different structures and the oxidant gas exhibits the same tendency as in the case of FIG. 8.

Thus, in First Embodiment, by adding an oxidant gas to two or more organic siloxane raw materials having mutually different structures, it is possible to achieve the higher deposition rate of the porous insulation film than that when an oxidant gas is added to a single organic siloxane raw material as in Comparative Example.

Figure 9:
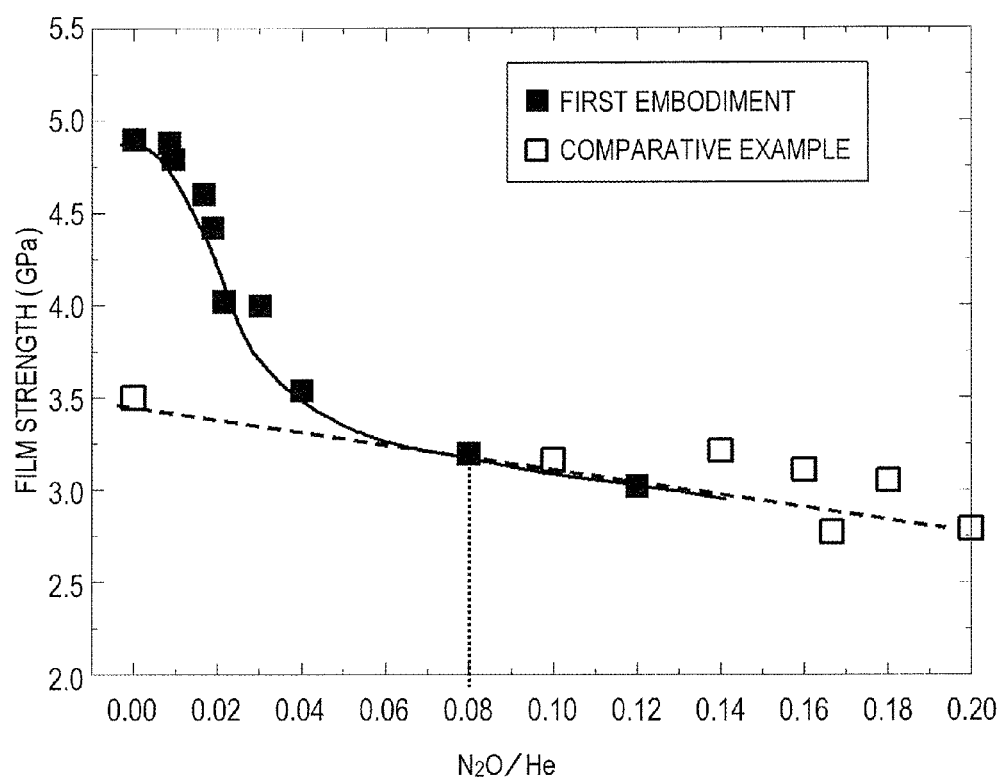
FIG. 9 is a view showing the relationship between the ratio of the oxidant gas flow rate to the carrier gas flow rate and the film strength of the porous insulation film.

FIG. 9 is a view showing the relationship between the ratio of the oxidant gas flow rate to the carrier gas flow rate, and the film strength of the porous insulation film. The horizontal axis in FIG. 9 is the same as that in FIG. 8. The vertical axis in FIG. 9 denotes the film strength (modulus) measured by a nanoindentation method. Further, in FIG. 9, plotting is also made for Comparative Example.

As in FIG. 9, in Comparative Example and Example, with an increase in ratio of the oxidant gas flow rate to the carrier gas flow rate, the film strength of the porous insulation film decreases. Namely, the film strength of the porous film is in the trade-off relation with respect to the deposition rate.

On the other hand, regardless of the ratio of the oxidant gas flow rate to the carrier gas flow rate, the film strength of Example using two organic siloxane raw materials is higher than the film strength of Comparative Example using only a single organic siloxane raw material. Particularly, in the region in which the ratio of the oxidant gas flow rate to the carrier gas flow rate is low, the film strength of Example is higher than the film strength of Comparative Example. Specifically, when the ratio of the oxidant gas flow rate to the carrier gas flow rate is 0.08 or less, the film strength in Example is higher than that in Comparative Example. When the ratio of the oxidant gas flow rate to the carrier gas flow rate is larger than 0.08, the film strength in Example is equal to that in Comparative Example.

Further, when the ratio of the oxidant gas flow rate to the carrier gas flow rate is 0.04 or less, the film strength in Example exhibits a remarkably higher value than that in Comparative Example even in consideration of the measurement error.

The tendency on the film strength in FIG. 9 is the same even when the ratio of the first organic siloxane raw material in which n is 3 and the second organic siloxane raw material in which n is 4 is a ratio other than 4:3. Incidentally, when the ratio of the first and second organic siloxane raw materials is 4:3, the film strength of the porous insulation film is the highest.

Further, the tendency is not limited to the case where the first organic siloxane raw material in which n is 3 and the second organic siloxane raw material in which n is 4 are mixed. Namely, even for combinations of other organic siloxane raw materials, mixing of two or more organic siloxane raw materials having mutually different structures exhibits the same tendency as in the case of FIG. 9.

Thus, in First Embodiment, by adding an oxidant gas to two or more organic siloxane raw materials having mutually different structures, it is possible to achieve the higher film strength of the porous insulation film than that when an oxidant gas is added to a single organic siloxane raw material as in Comparative Example.

From the results of FIGS. 8 and 9 up to this point, in First Embodiment, the ratio of the oxidant gas flow rate to the carrier gas flow rate is preferably more than 0 and 0.08 or less. Whereas, the ratio of the oxidant gas flow rate to the carrier gas flow rate is further preferably 0.005 or more and 0.04 or less.

As described in connection with FIG. 8, the ratio of the oxidant gas flow rate to the carrier gas flow rate is larger than 0 (i.e., the oxidant gas is added). As a result, it is possible to achieve a higher deposition rate than that when an oxidant gas is not added.

Whereas, the ratio of the oxidant gas flow rate to the carrier gas flow rate is preferably within a larger range than for contamination into the chamber CMB. From such a viewpoint, the ratio of the oxidant gas flow rate to the carrier gas flow rate is preferably 0.005 or more. As a result, it is possible to improve the deposition rate within the range equivalent to or larger than the control precision of the gas flow rate controller MC3 with stability.

As described in connection with FIG. 9, the ratio of the oxidant gas flow rate to the carrier gas flow rate is 0.08 or less. As a result, it is possible to more improve the film strength of the porous insulation film than that when only one organic siloxane raw material is used.

In FIG. 9, as described above, when the ratio of the oxidant gas flow rate to the carrier gas flow rate is 0.04 or less, the film strength in Example exhibits a remarkably higher value than that in Comparative Example even in consideration of the measurement error. In addition, even in consideration of the in-plane distribution of the porous insulation film, the gas distribution in manufacturing steps, the process margin, variations between batches, and the like, the ratio of the oxidant gas flow rate to the carrier gas flow rate is 0.04 or less.

As a result, it is possible to obtain a porous insulation film having a high film strength with stability.

Advantageous Effects

Then, a description will be given to the advantageous effects of First Embodiment together with the mechanism. First, the advantageous effects resulting from use of two or more organic siloxane raw materials having mutually different structures are as follows.

For example, when two of first and second organic siloxane raw materials are used, the second organic siloxane raw material having a cyclic siloxane skeleton with a weak bond energy is preferentially dissociated. At this step, some of the dissociated Si—O bonds link the molecules of the first organic siloxane raw materials. Namely, the first organic siloxane raw material can form a strong network via Si—O bonds. Therefore, it is possible to improve the film strength of the porous insulation film.

Then, the advantageous effects resulting from the addition of an oxidant gas in addition to the two or more organic siloxane raw materials can be considered as follows.

Into the two or more organic siloxane raw materials in a plasma state, is added an oxidant gas. This results in a decrease in mean free path of electrons in the plasma, and a decrease in ion energy. This is because the molecules of the oxidant gas become a steric barrier. For this reason, in First Embodiment, the dissociation efficiency of the second organic siloxane raw material with a weak bond energy decreases as compared with the case where an oxidant gas is not added. This makes it difficult to form the crosslinking structure of the first organic siloxane raw material by Si—O bonds.

Further, the oxidant gas draws some of carbon and hydrogen atoms in the side chains of the organic siloxane raw material. For this reason, a large number of active bonding species are formed in the side chains. Such active bonding species promote bonding between hydrocarbons. Particularly, when the raw material has an unsaturated hydrocarbon group, ring opening of the unsaturated hydrocarbon group promotes bonding between hydrocarbons. Therefore, in the porous insulation film formed by adding the oxidant gas, the crosslinking structures via hydrocarbons become predominant.

Thus, addition of the oxidant gas results in an increase in crosslinking structures via hydrocarbons in the porous insulation film. This can increase the deposition rate. However, with an increase in number of crosslinking structures via hydrocarbons, the film strength of the porous insulation film becomes lower than that the crosslinking structures of the first organic siloxane raw material via the Si—O bonds are predominant. Therefore, for the ratio of the oxidant gas flow rate to the carrier gas flow rate, there occurs the optimum range for making the deposition rate and the film strength compatible with each other.

As described up to this point, in accordance with First Embodiment, two or more organic siloxane raw materials each having a cyclic SiO structure as a main skeleton thereof, and having mutually different structures, and an oxidant gas including oxygen atoms are mixed to form a porous insulation film. At this step, the ratio of the added oxidant gas flow rate to the carrier gas flow rate is more than 0 and 0.08 or less. As a result, it is possible to increase the deposition rate of the porous insulation film, and it is possible to improve the film strength of the porous insulation film.

Incidentally, in First Embodiment, a description was given to the case where, the wire or the via was formed in the porous insulation film as the interlayer insulation film of the semiconductor device SD. However, the present invention is not limited to this case. The porous insulation film may also be used for others than the semiconductor device SD, and may be a monolayer film.

Second Embodiment

Figure 10:
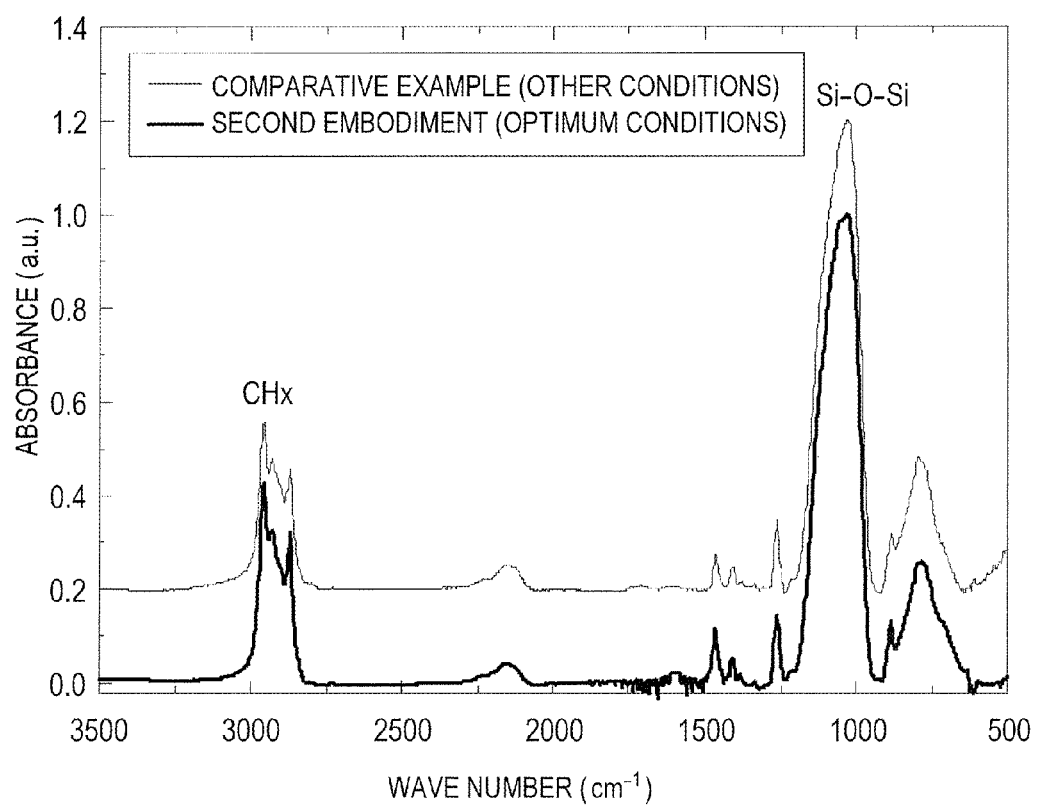
FIG. 10 is a view for illustrating the characteristics of a porous insulation film in accordance with Second Embodiment.
Figure 11:
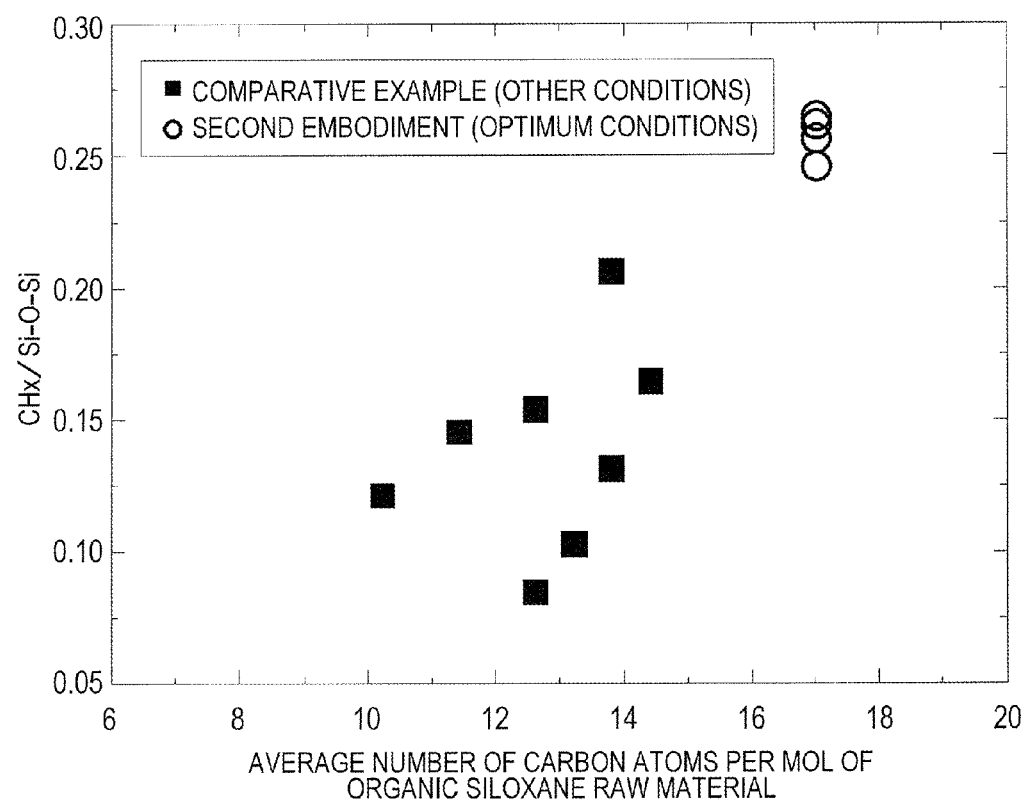
FIG. 11 is a view for illustrating the characteristics of the porous insulation film in accordance with Second Embodiment.

FIGS. 10 and 11 are each a view for illustrating the characteristics of a porous insulation film in accordance with Second Embodiment. Second Embodiment is the same as First Embodiment, except that the conditions for forming the porous insulation film are still more optimized than those in First Embodiment. Below, a detailed description will be given thereto.

The present inventors manufactured a porous insulation film using various organic siloxane raw materials in the manufacturing method of First Embodiment. As a result, they found that the deposition rate and the film strength were remarkably high under specific optimum conditions. The optimum conditions were found to be in correlation with "the average number of carbon atoms per mol of a mixed raw material of organic siloxane raw materials" as described later.

In accordance with Second Embodiment, in the mixed raw material of two or more of the organic siloxane raw materials, the average number of carbon atoms of the mixed raw material of the organic siloxane raw materials is 15 or more. Further, the peak area ratio of the peak of CHx in the vicinity of a wave number of 2900 $cm^{-1}$ to the peak of —Si—O—Si— in the vicinity of a wave number of 1100 $cm^{-1}$ determined by the FTIR method of the porous insulation film is 0.23 or more. Below, a detailed description will be given.

FIG. 10 shows the spectra measured by the FTIR: Fourier Transform Infrared Spectroscopy method for the porous insulation films of Second Embodiment and Comparative Example. Second Embodiment in the view is the porous insulation film manufactured under the optimum conditions of the conditions of First Embodiment. Whereas, Comparative Example in the view is the porous insulation film manufactured under different other conditions from the optimum conditions of the conditions of First Embodiment. Comparative Example described in connection with FIGS. 10 and 11 is different from Comparative Example in connection with FIGS. 8 and 9.

Specifically, in Second Embodiment (under the optimum conditions), there were used the first organic siloxane raw material represented by the chemical formula (1), where n is 3, Rx is a vinyl group, and Ry is an isopropyl group, and the second organic siloxane raw material represented by the chemical formula (1), where n is 4, Rx is a vinyl group, and Ry is an isopropyl group. In Comparative Example (under other conditions), there was used at least any one of the organic siloxane raw materials in which the number of carbon atoms in the side chain is smaller.

As in FIG. 10, for any of the porous insulation films, there is shown the peak of Si—O—Si bond in the vicinity of a wave number of 1100 $cm^{-1}$. Whereas, the peak of CHx is shown in the vicinity of a wave number of 2900 $cm^{-1}$. The peak of CHx results from the portions of the hydrocarbons in the porous insulation film at the side chains of the organic siloxane raw material left without dissociation. As shown, the peak of CHx of the porous insulation film manufactured under the optimum conditions is higher than the peak of CHx of the porous insulation film manufactured under other conditions.

FIG. 11 shows the relationship between the average number of carbon atoms per mol of the organic siloxane raw material, and the CHx/Si—O—Si ratio. The horizontal axis of FIG. 11 denotes the average number of carbon atoms per mol of the organic siloxane raw material. Incidentally, two or more organic siloxane raw materials are used. For this reason, the average number of carbon atoms is the value obtained by multiplying the number of carbons present in each organic siloxane raw material by the mixing ratio.

The vertical axis of FIG. 11 denotes "CHx/-Si—O—Si— ratio". The "CHx/-Si—O—Si— ratio" is the peak area ratio of the peak of CHx in the vicinity of a wave number of 2900 $cm^{-1}$ to the peak of —Si—O—Si— in the vicinity of a wave number of 1100 $cm^{-1}$ in the spectrum after removing the background of the spectra detected by FTIR as in FIG. 10. The "CHx/-Si—O—Si— ratio" is in correlation with the presence ratio of CHx to the —Si—O—Si— bond in the porous insulation film.

In FIG. 11, Second Embodiment (optimum conditions) is indicated with a hollow circle mark, and Comparative Example (other conditions) is indicated with a black square mark. As in FIG. 11, in Second Embodiment (under the optimum conditions), the average number of carbon atoms per mol of the organic siloxane raw material is 15 or more, and "CHx/-Si—O—Si— ratio" is 0.23 or more. Thus, in Second Embodiment (under the optimum conditions), the side chains of the organic siloxane raw material cause a large number of CHx's to be taken into the porous insulation film.

In Second Embodiment, the porous insulation film manufactured under the optimum conditions has the following features based on the used raw materials. The porous insulation film has Si, O, C, and H, a cyclic SiO structure, and an unsaturated hydrocarbon group and a branched hydrocarbon group bonded to Si. Further, as described above, the "CHx/-Si—O—Si— ratio" is 0.23 or more. For example, the unsaturated hydrocarbon group and the branched hydrocarbon group included in the porous insulation film are a vinyl group and an isopropyl group, respectively.

Then, a description will be given to the advantageous effects of Second Embodiment. In Second Embodiment (under the optimum conditions), it is considered that the following advantageous effects result in a remarkable increase in deposition rate and film strength. As described above, for example, when the two first and second organic siloxane raw materials are used, the second organic siloxane raw material having a cyclic siloxane skeleton with a weak bond energy is preferentially dissociated to link the molecules of the first organic siloxane raw material. This improves the film strength of the porous insulation film.

On the other hand, the phenomenon of dissociation of the cyclic siloxane skeleton also depends upon the side chains of the organic siloxane raw material. In Second Embodiment (under the optimum conditions), the average number of carbon atoms per mol of the two or more organic siloxane raw materials is 15 or more. Namely, in Second Embodiment, the number of carbons atoms included in the side chain is large. This results in a low probability of the dissociation of the side chain in a plasma.

On the contrary, in Second Embodiment, the probability of dissociation of the cyclic siloxane skeleton of the second organic siloxane raw material becomes higher than that of the side chain. As a result, in Second Embodiment, a large number of side chains of the organic siloxane raw material remain. Therefore, in FIG. 11, it is considered that the porous insulation film manufactured under the optimum conditions as in Second Embodiment is higher in "CHx/-Si—O—Si— ratio" than the porous insulation films manufactured under other conditions.

By the mechanism described up to this point, in accordance with Second Embodiment, it is possible to increase the deposition rate of the porous insulation film and to improve the film strength of the porous insulation film furthermore than in First Embodiment.

Third Embodiment

There were used the first and second cyclic organic siloxanes represented by the chemical formula (1). Of these, as the first cyclic organic siloxane, there was used the one where R1(Rx) is a vinyl group, R2(Ry) is an isopropyl group, and n=3 (2,4,6-triisopropyl-2,4,6-trivinylcyclotrisiloxane). Whereas, as the second cyclic organic siloxane, there was used the one where R1(Rx) is a vinyl group, R2(Ry) is an isopropyl group, and n=4 (2,4,6,8-tetraisopropyl-2,4,6,8-tetravinylcyclotrisiloxane). For the carrier gas, He was used. For the oxidant, $N_2O$ was used. The flow rate of the oxidant was set so as to be 0.06 relative to the gas flow rate.

Figure 20:
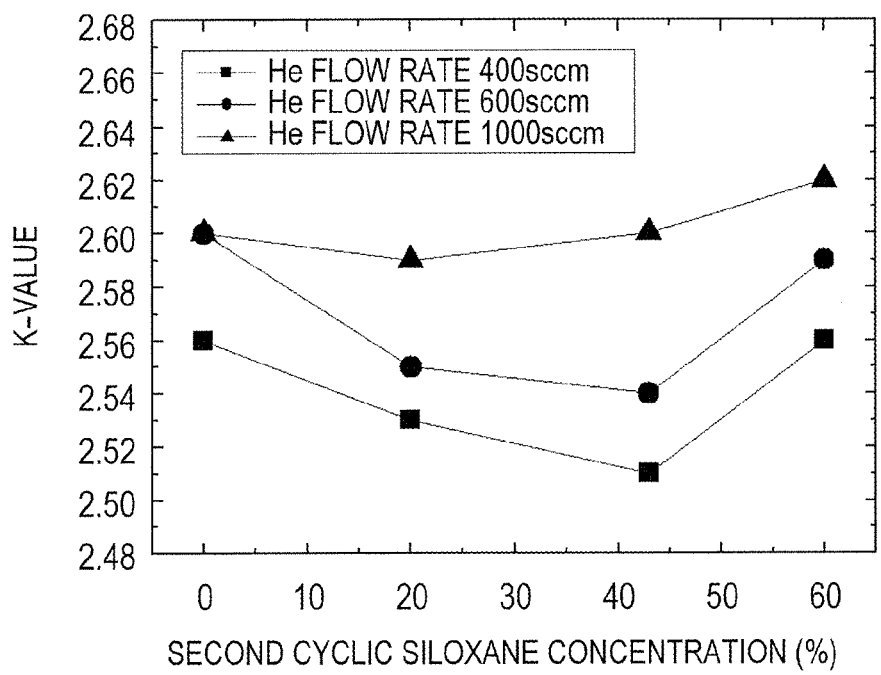
FIG. 20 is a view for illustrating the characteristics of a porous insulation film in accordance with Third Embodiment.

FIG. 20 is a graph showing changes in k value when the mixing concentration of the second cyclic siloxane raw material is set as a variable. From the result, it has been shown that the lowest k value is exhibited at a second cyclic siloxane concentration of around 20 to 45% (the second cyclic organic siloxane raw material: ¾ to the first cyclic organic siloxane raw material: 1).

Figure 21:
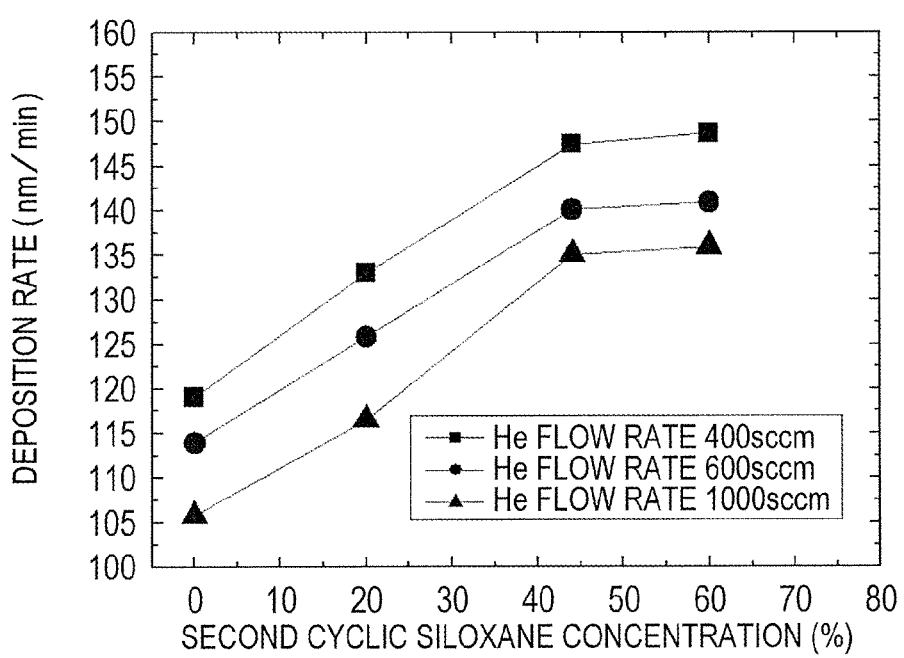
FIG. 21 is a view for illustrating the characteristics of the porous insulation film in accordance with Third Embodiment.

FIG. 21 is a graph showing changes in deposition rate when the mixing concentration of the second cyclic siloxane raw material is set as a variable. From the result, it has been shown that the deposition rate exhibits the maximum value at a second cyclic siloxane concentration of 43%, and does not change even at a higher concentration than that.

Figure 22:
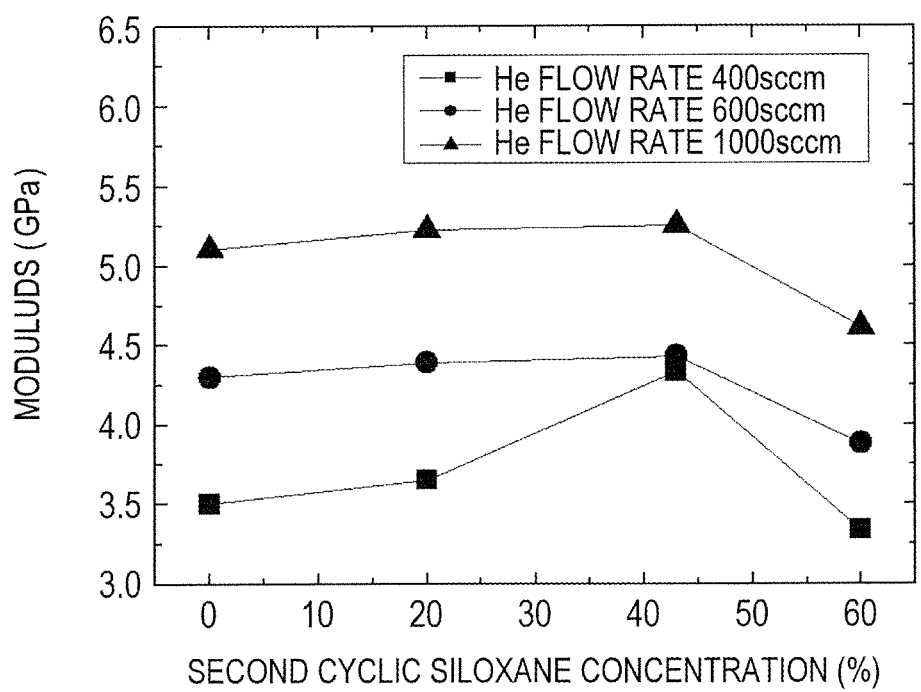
FIG. 22 is a view for illustrating the characteristics of the porous insulation film in accordance with Third Embodiment.

FIG. 22 is a graph showing changes in film strength when the mixing concentration of the second cyclic siloxane raw material is set as a variable. From the result, it has been shown that the film strength exhibits the maximum value at a second cyclic siloxane concentration of 43%, and does not change even at a higher concentration than that.

Fourth Embodiment

Figure 12:
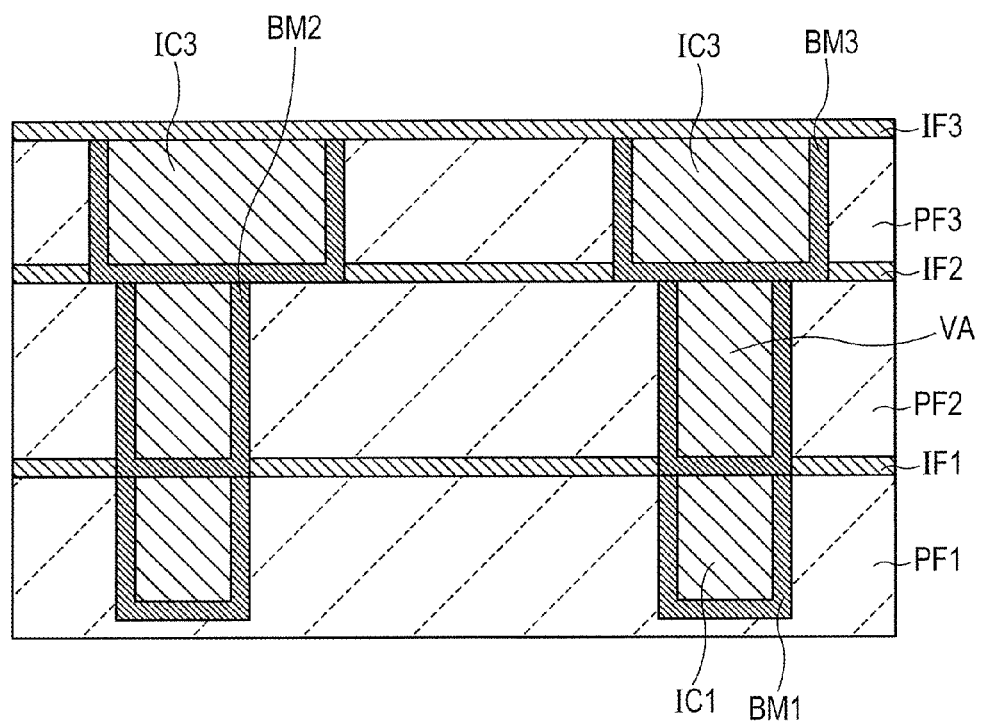
FIG. 12 is a cross-sectional view showing a configuration of a semiconductor device in accordance with Fourth Embodiment.

FIG. 12 is a cross-sectional view showing a configuration of a semiconductor device SD in accordance with Fourth Embodiment. Fourth Embodiment is the same as First Embodiment, except that a multilayer wiring layer is formed by a single damascene method. Below, a detailed description will be given.

As in FIG. 12, over a barrier insulation film IF1, there is disposed a porous insulation film PF2. In the porous insulation film PF2, vias VA are disposed by, for example, a single damascene method. At the side surface and the bottom surface of each via VA, there is disposed a barrier metal BM2.

Over the porous insulation film PF2, there is disposed a barrier insulation film IF2. Over the barrier insulation film IF2, there is disposed a porous insulation film PF3. In the porous insulation film PF3, wires IC3 are disposed by, for example, a single damascene method. At the side surface and the bottom surface of each wire IC3, there is disposed a barrier metal BM3. The wire IC3 is coupled to the wire IC1 situated at the underlying layer via the via VA.

Then, referring to FIGS. 13A and 13B to 16, a description will be given to a method for manufacturing a semiconductor device SD in accordance with Fourth Embodiment. FIGS. 13A and 13B to 16 are each a cross-sectional view for illustrating the method for manufacturing the semiconductor device SD in accordance with Fourth Embodiment. The method for manufacturing a semiconductor device SD in accordance with Fourth Embodiment is the same as that of First Embodiment, except for being a single damascene method.

Figure 13A:
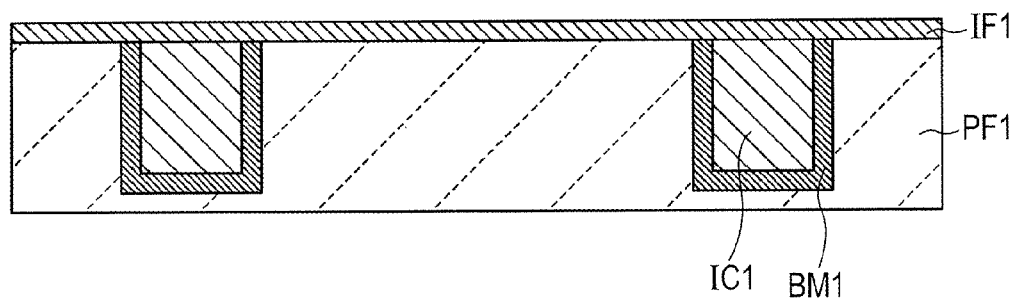
FIGS. 13A and 13B are each a cross-sectional view for illustrating a method for manufacturing the semiconductor device in accordance with Fourth Embodiment.

As in FIG. 13A, over a substrate (not shown), there is formed a porous insulation film PF1 having a wire IC1. Then, over the porous insulation film PF1, there is formed a barrier insulation film IF1.

Figure 13B:
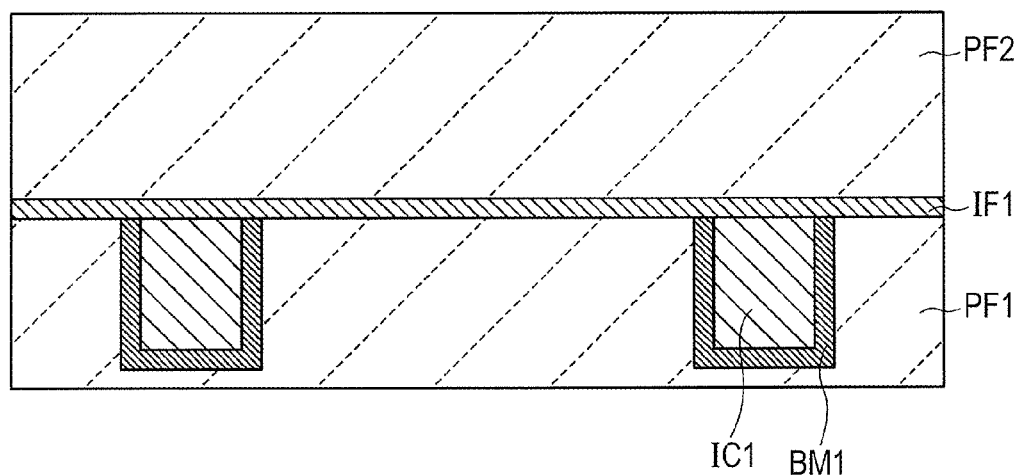

Then, as in FIG. 13B, using an organic siloxane raw material including hydrocarbons, over the barrier insulation film IF1, there is formed a porous insulation film PF2. Then, although not shown, over the porous insulation film PF2, there is formed a hard mask HM.

Figure 14A:
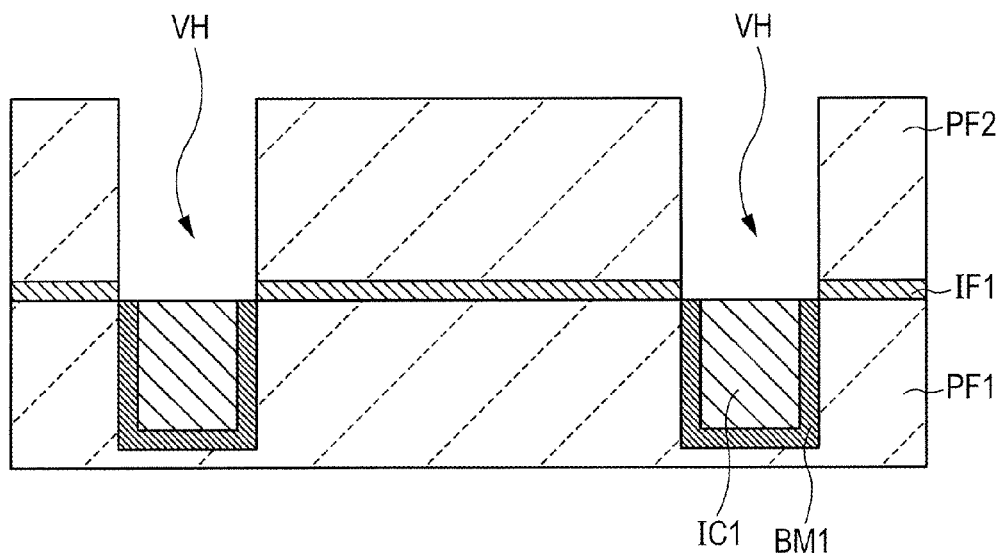
FIGS. 14A and 14B are each a cross-sectional view for illustrating a method for manufacturing the semiconductor device in accordance with Fourth Embodiment.

Then, as in FIG. 14A, by, for example, a RIE method, the porous insulation film PF2 is selectively removed. As a result, in the porous insulation film PF2, there are formed via holes VH.

Figure 14B:
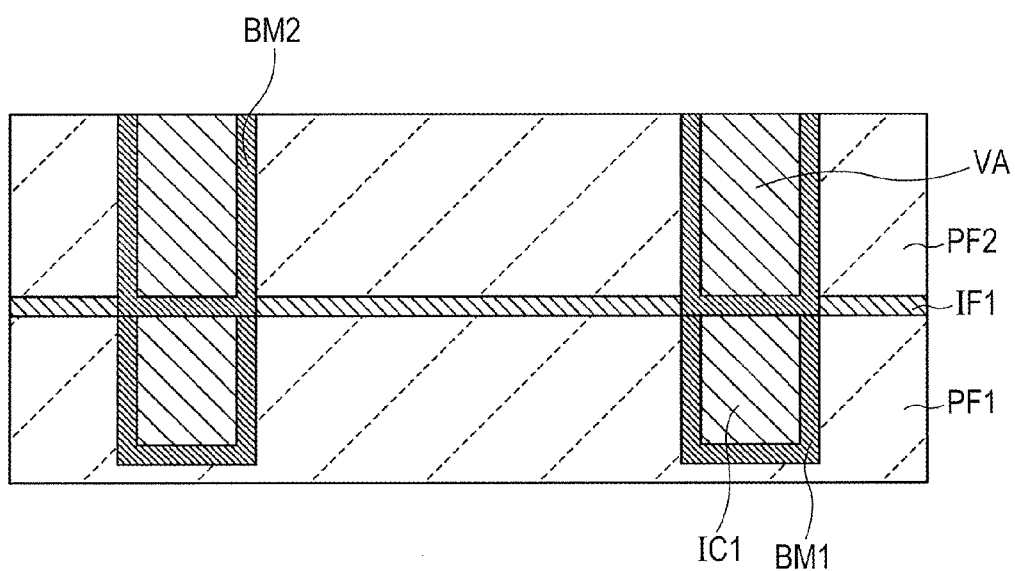

Then, as in FIG. 14B, at the side surface and the bottom surface of each via hole VH, there is formed a barrier metal BM2. Then, in each via hole VH, there is formed a metal film MF. Then, a heat treatment is performed for Cu grain growth.

Then, by a CMP method, the metal film MF is polished, so that the metal is embedded in the via hole VH. As a result, in the porous insulation film PF2, the via VA is formed. At this step, the hard mask HM may be removed. Further, the surface layer of the porous insulation film PF2 may be removed.

Figure 15A:
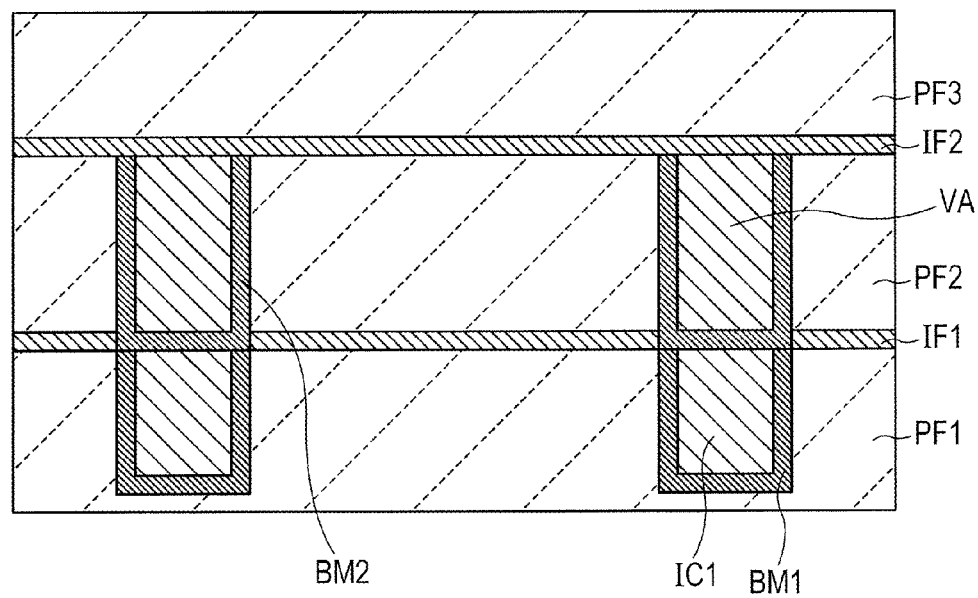
FIGS. 15A and 15B are each a cross-sectional view for illustrating a method for manufacturing the semiconductor device in accordance with Fourth Embodiment.

Then, as in FIG. 15A, over the porous insulation film PF2, there is formed a barrier insulation film IF2. Then, over the barrier insulation film IF2, as with the porous insulation film PF2, there is formed a porous insulation film PF3.

Figure 15B:
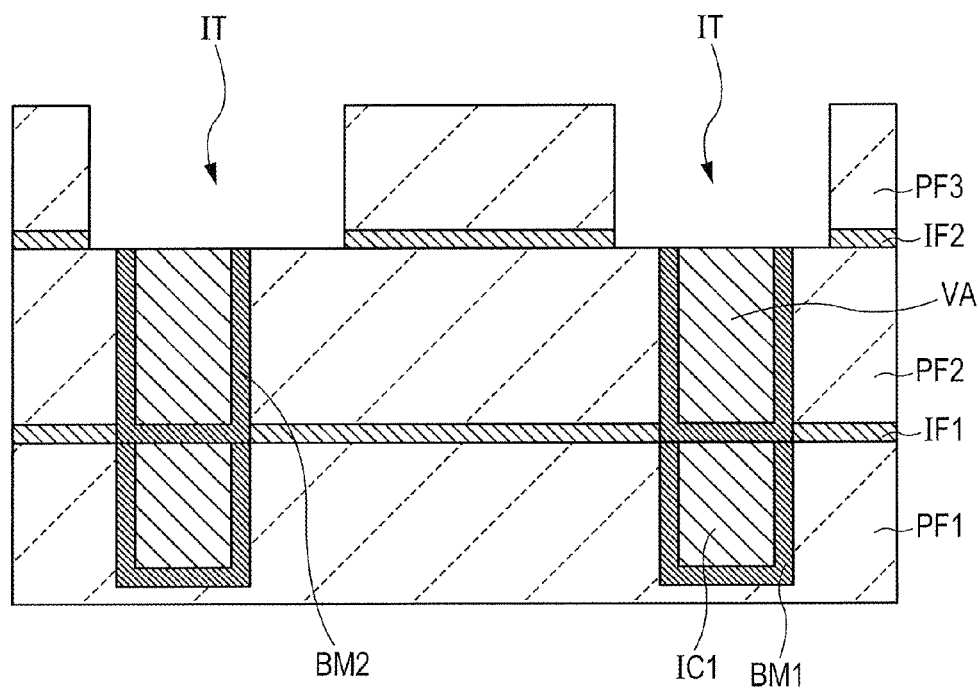

Then, as in FIG. 15B, by, for example, a RIE method, the porous insulation film PF3 is selectively removed. As a result, in the porous insulation film PF3, there are formed trenches IT.

Figure 16:
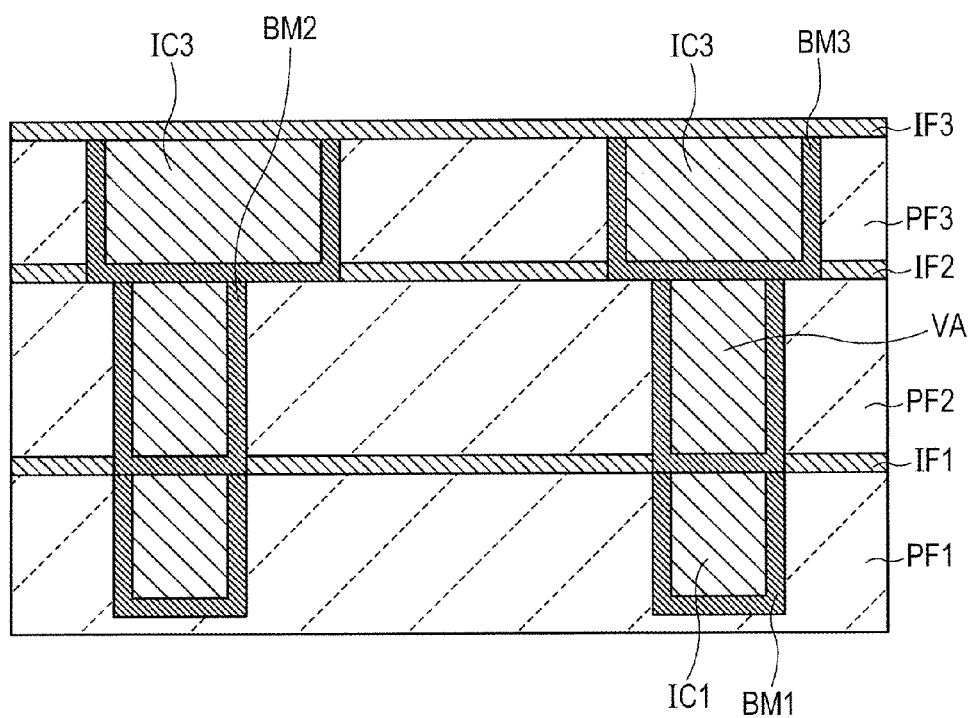
FIG. 16 is a cross-sectional view for illustrating a method for manufacturing the semiconductor device in accordance with Fourth Embodiment.

Then, as in FIG. 16, at the side surface and the bottom surface of each trench IT, there is formed a barrier metal BM3. Then, in each trench IT, there is formed a metal film MF. Then, a heat treatment is performed for Cu grain growth.

Then, by a CMP method, the metal film MF is polished, so that a metal is embedded in each trench IT. As a result, in the porous insulation film PF2, there is formed a wire IC3. Then, over the porous insulation film PF2, there is formed a barrier insulation film IF3.

In accordance with Fourth Embodiment, it is possible to obtain the same effects as those of First Embodiment. As in Second Embodiment, a single damascene method may be used.

Fifth Embodiment

Figure 17:
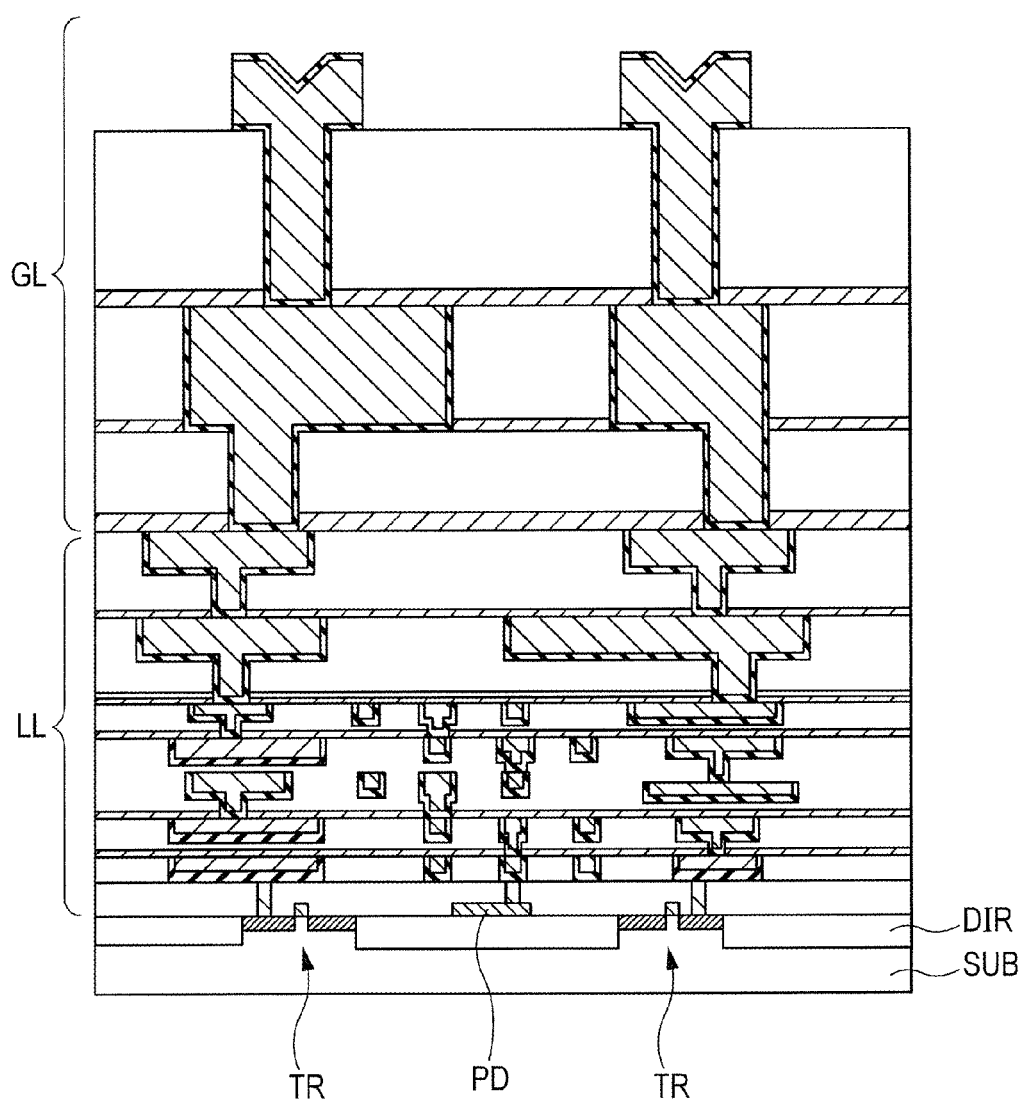
FIG. 17 is a cross-sectional view showing a configuration of a semiconductor device in accordance with Fifth Embodiment.

FIG. 17 is a cross-sectional view showing a configuration of a semiconductor device SD in accordance with Fifth Embodiment. Fifth Embodiment is the same as First Embodiment, except that transistors TR and the like are formed in a substrate SUB. Below, a detailed description will be given.

As in FIG. 17, in the substrate SUB, there is formed an element isolation region DIR having openings. The substrate SUB is, for example, a semiconductor substrate. Specifically, the substrate SUB is a silicon substrate.

In each opening of the element isolation region DIR, there is formed the transistor TR. The transistor TR includes, for example, impurity-implanted source region, drain region, and extension region, a gate insulation film formed over the substrate SUB, and a gate electrode formed over the gate insulation film (all reference signs not shown).

Over the element isolation region DIR, there may be disposed a passive element PD. The passive element PD is, for example, a resistance element formed of polysilicon.

Over the substrate SUB and the element isolation region DIR, there is formed a multilayer wiring layer. The multilayer wiring layer includes at least one or more layers of the same porous insulation films as those of First Embodiment.

The multilayer wiring layer includes a local wiring layer LL and a global wiring layer GL. The local wiring layer LL is a wiring layer for forming a circuit. The global wiring layer GL is a wiring layer for routing a power source wire and a grounding wire. The uppermost layer of the global wiring layer GL is, for example, an Al wiring layer. The wiring layer includes electrode pads. The wiring layer forming the local wiring layer LL, and some layers of the global wiring layer GL are formed by a damascene method.

Herein, for example, the second and upper interlayer insulation layers of the local wiring layer LL are all the same porous insulation films as those of First Embodiment. Further, for example, the interlayer insulation layers of the global wiring layer GL, except for the uppermost-layer wiring layer are the same porous insulation films as those of First Embodiment. Incidentally, all the interlayer insulation layers may be porous insulation films.

A method for manufacturing the semiconductor device SD in accordance with Fifth Embodiment is the same as that of First Embodiment, except that transistors TR and the like are formed at the substrate SUB.

For example, the element isolation region DIR having openings (reference sign not shown) is formed by a STI (Shallow Trench Isolation) method, in the substrate SUB. Incidentally, the element isolation region DIR may be formed by a LOCOS (Local Oxidation of Silicon) method.

Then, over the substrate SUB, there are formed a gate insulation layer and a gate electrode. At this step, a passive element PD is also formed over the element isolation region DIR simultaneously.

Then, with the gate insulation layer and the gate electrode as a mask, the substrate SUB is ion-implanted with impurities, thereby to form an extension region. Then, at the sidewalls of the gate insulation layer and the gate electrode, there is formed a sidewall insulation film. Then, using these as a mask, the substrate SUB is ion-implanted with impurities, thereby to form a source region and a drain region. By the procedure up to this point, the transistor TR is formed.

Then, over the substrate SUB and the element isolation region DIR, there is formed a multilayer wiring layer. As at least one interlayer insulation layer of the multilayer wiring layer, there is formed the porous insulation film of First Embodiment.

In accordance with Fifth Embodiment, it is possible to obtain the same effects as those of First Embodiment. As in Fourth Embodiment, it is also acceptable that semiconductor elements such as transistors TR are formed at the substrate SUB.

Sixth Embodiment

Figure 18A:
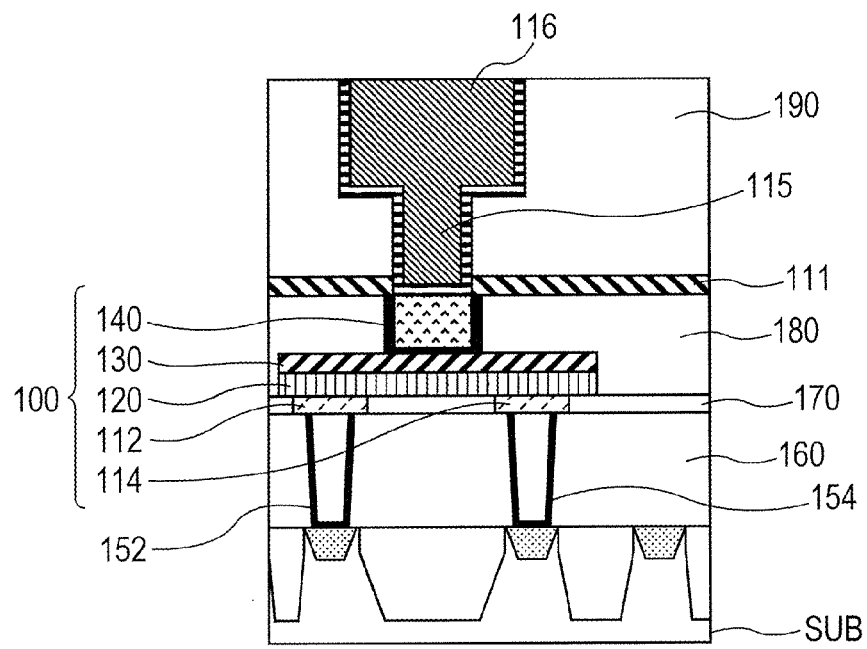
FIGS. 18A and 18B are each a cross-sectional view showing a semiconductor device in accordance with Sixth Embodiment.
Figure 18B:
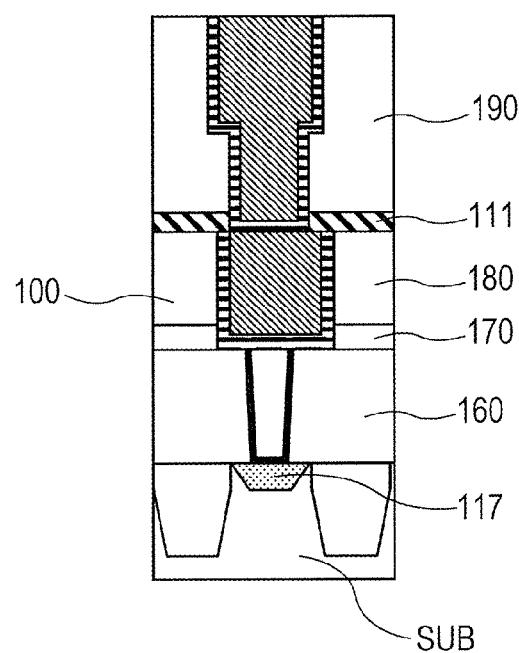

FIGS. 18A and 18B are each a cross-sectional view showing a configuration of a semiconductor device in accordance with Sixth Embodiment. Sixth Embodiment is the same as First Embodiment, except that a transistor TR and the like are formed at the substrate SUB. Below, a detailed description will be given.

FIGS. 18A and 18B are each a cross-sectional view of a merged MRAM (Magnetic Random Access Memory). In the semiconductor device of FIGS. 18A and 18B, there are merged a MTJ element (Magnetic Tunnel Junction) 100 (FIG. 18A) and a logic circuit (FIG. 18B).

A MRAM performs a 0 or 1 determination according to the magnetization direction of the magnetic body, and thereby operates as a memory element. Generally, the modes of reversal of magnetization of the magnetic body include two of reversal domain nucleation and domain wall displacement. Although the present invention is applicable to both types, in the present example, a description will be given with the domain wall displacement type element as an example.

As shown in FIG. 18A, over the substrate SUB, there are stacked porous insulation films 160, 170, 180, and 190 in this order. The merged MRAM has a MTJ element 100. The MTJ element 100 has a structure in which spin absorption layers 112 and 114, a domain wall displacement layer 120, a tunnel barrier layer 130, and a pin layer 140 are stacked in this order. The bottom surfaces of the spin absorption layers 112 and 114 are coupled to a diffusion layer via contacts 152 and 154, respectively. The contacts 152 and 154 are embedded in the porous insulation film 160. The spin absorption layers 112 and 114 are embedded in the porous insulation film 170. The domain wall displacement layer 120, the tunnel barrier layer 130, and the pin layer 140 are embedded in the porous insulation film 180. A wire 111 is formed over the porous insulation film 180. The top surface of the pin layer 140 is not covered with the porous insulation film 180, and is coupled to the wire 111. Over the wire 111, there are formed a via 115 and a wire 116. The via 115 and the wire 116 are embedded in a porous insulation film 190.

Incidentally, as shown in FIG. 18B, in the logic region, there is formed a transistor forming a logic circuit. FIG. 18B shows source/drain region 117 of the transistor.

For each of the devices in which the porous insulation films of Embodiment are applied and devices in which the porous insulation films of Comparative Example are applied, as the porous insulation films 160, 170, 180, and 190 of the merged MRAM shown in FIGS. 18A and 18B, respectively, there was examined the hysteresis characteristics of the antiferromagnetic layer. Herein, in Comparative Example, the porous insulation films including pores introduced therein using porogen and a cure process in combination were used as the porous insulation films 160, 170, 180, and 190.

In the present embodiment, the deposition temperature was set at 350° C. On the other hand, in Comparative Example, the deposition temperature was 350° C. In addition, heating to 400° C. was performed during the cure process.

Figure 19A:
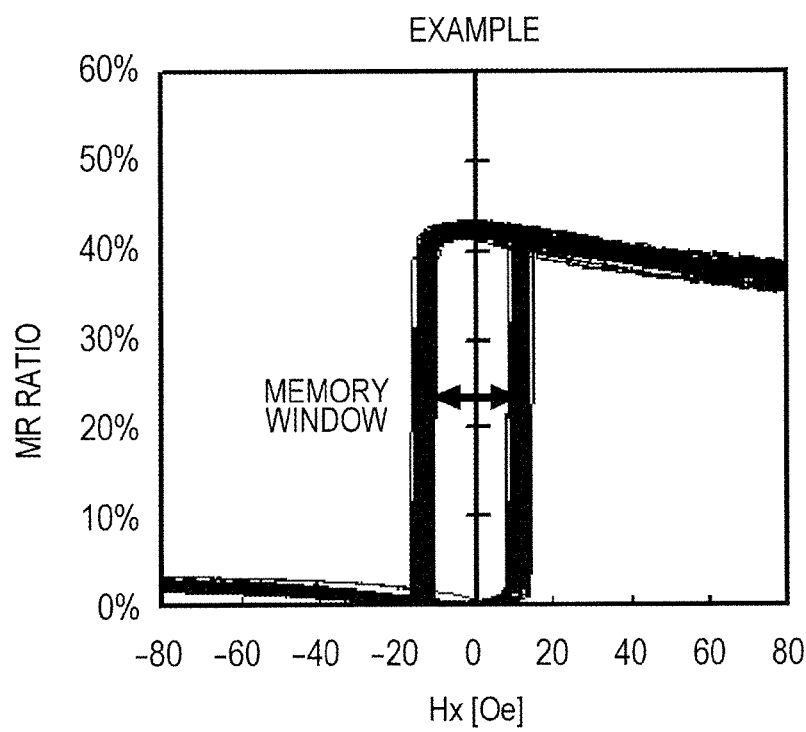
FIGS. 19A and 19B are each a view for illustrating the characteristics of the semiconductor device in accordance with Sixth Embodiment.
Figure 19B:
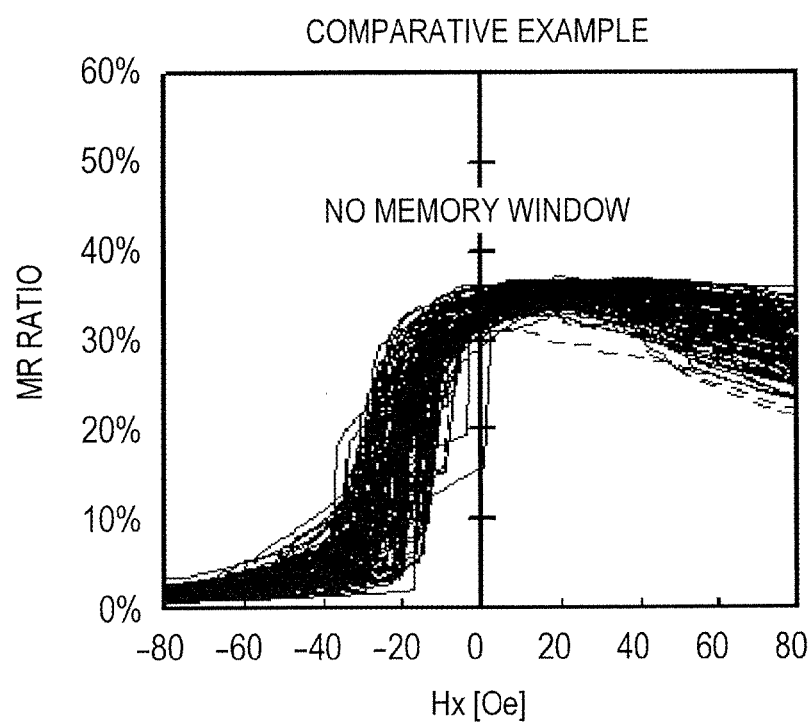

FIGS. 19A and 19B each show the hysteresis characteristics. FIG. 19A shows the results of Embodiment, and FIG. 19B shows the results of Comparative Example. The horizontal axis of each of FIGS. 19A and 19B denotes the magnetic filed, and the vertical axis denotes the resistance ratio. In the present embodiment, a memory window is held (a binary can be given within a given range (memory window)), and hence the present embodiment can operate as a device. On the other hand, when the porous insulation films of Comparative Example are applied, no memory window is observed, which makes it difficult to give a binary. Namely, it has been shown that the device of Comparative Example does not operate as a device.

In the present embodiment, a cure process was not performed. For this reason, the process temperature can be set at 350° C. or less. However, in Comparative Example, the device has undergone heat history of 400° C. due to the cure process. When the MTJ element is subjected to a heat treatment at 400° C. or more, the following phenomena are supposed to occur. One is as follows: the heat treatment changes the crystal structures of the antiferromagnetic layers (e.g., the spin absorption layers 112 and 114, the domain wall displacement layer 120, and the pin layer 140), which results in a change in magnetization direction of the antiferromagnetic layer; as a result, it becomes impossible to fix the magnetization direction of the pin layer. Another is as follows: the heat treatment causes metal diffusion through the tunnel barrier layer 130, resulting in changes in magnetization characteristics of the domain wall displacement layer 120, and the pin layer 140. These conceivably caused malfunction of the device when the porous insulation films 160, 170, 180, and 190 of Comparative Example were applied. On the other hand, in the present embodiment, it is considered as follows: when the porous insulation films 160, 170, 180, and 190 are formed, only heat history up to 350° C. is applied; this prevents the MTJ element 100 from undergoing a malfunction, which allows the operation.

Incidentally, when the raw materials shown in Third Embodiment are used, the porous insulation films can be grown even at 350° C. or less, for example, at a low temperature such as 200° C. By using the raw materials shown in Third Embodiment, it is also possible to further suppress the thermal load on the MTJ element 100. The growth temperature range may be 350° C. to 25° C. However, in consideration of the stability of the porous insulation films 160, 170, 180, and 190, a temperature of 200° C. or more to 350° C. or less is desirable.

Thus, in the present embodiment, the step of depositing the porous insulation films 160, 170, 180, and 190 does not include a porogen sublimation process, and is performed by setting the substrate temperature at 200° C. or more and 350° C. or less.

Further, semiconductor device manufactured by the present embodiment has a multilayer wiring layer including porous insulation films. At least any one layer of the porous insulation films is the porous insulation film manufactured by the method shown in the embodiment. Then, a memory element is formed in the multilayer wiring layer. The memory element is the MTJ element 100.

Up to this point, the invention made by the present inventors was specifically described by way of embodiments. However, it is naturally understood that the present invention is not limited to the embodiments, and may be variously changed within the scope not departing from the gist thereof.

Incidentally, the embodiments up to this point also disclose the following inventions.
(Additional Statement 1)

A method for manufacturing a semiconductor device, the method including a porous insulation film formation step of: vaporizing two or more organic siloxane raw materials each having a cyclic SiO structure as a main skeleton thereof, and having mutually different structures, transporting the vaporized raw materials with a carrier gas to a reactor, and adding an oxidant gas including an oxygen atom thereto, and forming a porous insulation film by a plasma CVD (Chemical Vapor Deposition) method or a plasma polymerization method in the reactor; in the porous insulation film formation step, the ratio of the flow rate of the added oxidant gas to the flow rate of the carrier gas is more than 0 and 0.08 or less.
(Additional Statement 2)

The method for manufacturing a semiconductor device according to Additional Statement 1, in which the ratio of the flow rate of the oxidant gas to the flow rate of the carrier gas is 0.005 or more and 0.04 or less.
(Additional Statement 3)

The method for manufacturing a semiconductor device according to Additional Statement 1, in which the oxidant gas includes at least one or more of $O_2$, $CO_2$, CO, $N_2O$, or $NO_2$.

(Additional Statement 4)

The method for manufacturing a semiconductor device according to Additional Statement 1, in which the organic siloxane raw material has a cyclic organic silica skeleton represented by the following chemical formula (1):

[Chemical formula 1]

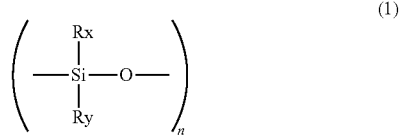

(where in the chemical formula (1), n is 2 to 5, Rx and Ry are each any of hydrogen, an unsaturated hydrocarbon group, and a saturated hydrocarbon group, and each of the unsaturated hydrocarbon group and the saturated hydrocarbon group is any of a vinyl group, an allyl group, a methyl group, an ethyl group, a propyl group, an isopropyl group, a butyl group, and a tertiary butyl group.)
(Additional Statement 5)

The method for manufacturing a semiconductor device according to Additional Statement 1, in which in at least two of the organic siloxane raw materials, n's are different from each other.
(Additional Statement 6)

The method for manufacturing a semiconductor device according to Additional Statement 1, in which in at least one of the organic siloxane raw materials, n is 3.
(Additional Statement 7)

The method for manufacturing a semiconductor device according to Additional Statement 1, in which in at least two of the organic siloxane raw materials, one n is 3, and the other n is 4.
(Additional Statement 8)

The method for manufacturing a semiconductor device according to Additional Statement 1, in which the organic siloxane raw material has an unsaturated hydrocarbon group.
(Additional Statement 9)

The method for manufacturing a semiconductor device according to Additional Statement 1, in which in a mixed raw material of the two or more organic siloxane raw materials, the average number of carbon atoms per mol of the mixed raw material of the organic siloxane raw materials is 15 or more, and in which the peak area ratio of the peak of CHx in the vicinity of a wave number of 2900 $cm^{-1}$ to the peak of —Si—O—Si— in the vicinity of a wave number of 1100 $cm^{-1}$ determined by a FTIR (Fourier Transform Infrared Spectroscopy) method of the porous insulation film is 0.23 or more.
(Additional Statement 10)

The method for manufacturing a semiconductor device according to Additional Statement 1, in which the ratio of the flow rate of the oxidant gas to the flow rate of the organic siloxane raw material is 0.1 or more and 5 or less.
(Additional Statement 11)

The method for manufacturing a semiconductor device according to Additional Statement 1, in which the porous insulation film is formed over a substrate, and the substrate is heated to 250° C. or more and 400° C. or less.
(Additional Statement 12)

The method for manufacturing a semiconductor device according to Additional Statement 1, further including a step of: after the porous insulation film formation step, forming a

What is claimed is:

1. A method for manufacturing a porous insulation film, the method comprising a step of:
vaporizing two or more organic siloxane raw materials each having a cyclic SiO structure as a main skeleton thereof, and having mutually different structures, transporting the vaporized raw materials with a carrier gas to a reactor, and adding an oxidant gas including an oxygen atom thereto, and forming a porous insulation film by a plasma CVD (Chemical Vapor Deposition) method or a plasma polymerization method in the reactor,
wherein in the step, the ratio of the flow rate of the added oxidant gas to the flow rate of the carrier gas is more than 0 and 0.08 or less.

2. The method for manufacturing a porous insulation film according to claim 1,
wherein the ratio of the flow rate of the oxidant gas to the flow rate of the carrier gas is 0.005 or more and 0.04 or less.

3. The method for manufacturing a porous insulation film according to claim 1,
wherein the oxidant gas includes at least one or more of $O_2$, $CO_2$, CO, $N_2O$, or $NO_2$.

4. The method for manufacturing a porous insulation film according to claim 1,
wherein the organic siloxane raw material has a cyclic organic silica skeleton represented by the following chemical formula (1):

[Chemical formula 1]

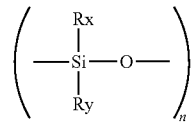

(1)

(where in the chemical formula (1), n is 2 to 5, Rx and Ry are each any of hydrogen, an unsaturated hydrocarbon group, and a saturated hydrocarbon group, and each of the unsaturated hydrocarbon group and the saturated hydrocarbon group is any of a vinyl group, an allyl group, a methyl group, an ethyl group, a propyl group, an isopropyl group, a butyl group, and a tertiary butyl group.)

5. The method for manufacturing a porous insulation film according to claim 1,
wherein in at least two of the organic siloxane raw materials, n's are different from each other.

6. The method for manufacturing a porous insulation film according to claim 1,
wherein in at least one of the organic siloxane raw materials, n is 3.

7. The method for manufacturing a porous insulation film according to claim 1,
wherein in at least two of the organic siloxane raw materials, one n is 3, and the other n is 4.

8. The method for manufacturing a porous insulation film according to claim 1,
wherein when in at least two of the organic siloxane raw materials, one n is 3, and the other n is 4, the mixing concentration of the siloxane raw material with an n of 4 is 20 to 45%.

9. The method for manufacturing a porous insulation film according to claim 1,
wherein the organic siloxane raw material has an unsaturated hydrocarbon group.

10. The method for manufacturing a porous insulation film according to claim 1,
wherein in a mixed raw material of the two or more organic siloxane raw materials, the average number of carbon atoms per mol of the mixed raw material of the organic siloxane raw materials is 15 or more, and
wherein the peak area ratio of the peak of CHx in the vicinity of a wave number of 2900 $cm^{-1}$ to the peak of —Si—O—Si—in the vicinity of a wave number of 1100 $cm^{-1}$ determined by a FTIR (Fourier Transform Infrared Spectroscopy) method of the porous insulation film is 0.23 or more.

11. The method for manufacturing a porous insulation film according to claim 1,
wherein the ratio of the flow rate of the oxidant gas to the flow rate of the organic siloxane raw material is 0.1 or more and 5 or less.

12. The method for manufacturing a porous insulation film according to claim 1,
wherein the porous insulation film is formed over a substrate, and the substrate is heated to 250° C. or more and 400° C. or less.

13. A method for manufacturing a semiconductor device, the method comprising a porous insulation film formation step of:
vaporizing two or more organic siloxane raw materials each having a cyclic SiO structure as a main skeleton thereof, and having mutually different structures, transporting the vaporized raw materials with a carrier gas to a reactor, and adding an oxidant gas including an oxygen atom thereto, and forming a porous insulation film by a plasma CVD (Chemical Vapor Deposition) method or a plasma polymerization method in the reactor,
wherein in the porous insulation film formation method, the ratio of the flow rate of the added oxidant gas to the flow rate of the carrier gas is more than 0 and 0.08 or less.

* * * * *